United States Patent
Gu et al.

(10) Patent No.: US 8,560,256 B2
(45) Date of Patent: Oct. 15, 2013

(54) ELECTRICAL POWER SYSTEM SENSOR DEVICES, ELECTRICAL POWER SYSTEM MONITORING METHODS, AND ELECTRICAL POWER SYSTEM MONITORING SYSTEMS

(75) Inventors: John A. Gu, Rockaway, NJ (US); Chuck-yan Wu, San Gabriel, CA (US); Matthew K. Donnelly, Gallatin Gateway, MT (US); Jerry C. L. Kwok, Kew Garden, NY (US)

(73) Assignee: Nexlent, LLC, Rockaway, NJ (US)

( * ) Notice: Subject to any disclaimer, the term of this patent is extended or adjusted under 35 U.S.C. 154(b) by 521 days.

(21) Appl. No.: 12/838,270

(22) Filed: Jul. 16, 2010

(65) Prior Publication Data
US 2011/0172938 A1    Jul. 14, 2011

Related U.S. Application Data

(60) Provisional application No. 61/271,189, filed on Jul. 18, 2009.

(51) Int. Cl.
*G01R 21/00*    (2006.01)
*G06F 11/30*    (2006.01)

(52) U.S. Cl.
USPC .............. 702/62; 702/116; 702/117; 702/183

(58) Field of Classification Search
USPC ................ 702/62–76, 116–123, 179–188
See application file for complete search history.

(56) References Cited

U.S. PATENT DOCUMENTS

| | | | |
|---|---|---|---|
| 6,177,884 B1 | 1/2001 | Hunt et al. | |
| 6,711,512 B2 | 3/2004 | Noh | |
| 6,756,776 B2 | 6/2004 | Perkinson et al. | |
| 7,191,074 B2 | 3/2007 | Rostron et al. | |
| 7,369,045 B2 * | 5/2008 | Hansen ..................... | 340/538.16 |
| 2004/0183522 A1 * | 9/2004 | Gunn et al. .................... | 324/126 |
| 2005/0206530 A1 | 9/2005 | Cumming et al. | |
| 2005/0286190 A1 * | 12/2005 | Rostron et al. .................. | 361/65 |
| 2005/0288877 A1 | 12/2005 | Doig et al. | |
| 2006/0125469 A1 | 6/2006 | Hansen | |

(Continued)

FOREIGN PATENT DOCUMENTS

| | | |
|---|---|---|
| KR | 10-2009-0050671 | 5/2009 |
| WO | PCT/US2010/042335 | 2/2011 |
| WO | PCT/US2010/042335 | 1/2012 |

OTHER PUBLICATIONS

"Synchronized Phasor Measurements in Power Systems," by AG Phadke, IEEE Computer Applications in Power, Apr. 1993, pp. 10-15.

(Continued)

*Primary Examiner* — Phuong Huynh
(74) *Attorney, Agent, or Firm* — Wells St. John P.S.

(57) ABSTRACT

Electrical power system sensor devices, electrical power system monitoring methods, and electrical power system monitoring systems are disclosed according to some aspects of the description. In one aspect, an electrical power system sensor device includes sensor circuitry configured to monitor a characteristic of electrical energy which is conducted using an electrical conductor of an electrical power system, an attachment assembly configured to position the sensor circuitry with respect to the electrical conductor wherein the sensor circuitry monitors the characteristic of the electrical energy which is conducted within the electrical conductor of the electrical power system, and wherein the sensor circuitry is electrically isolated from the electrical conductor of the electrical power system.

39 Claims, 25 Drawing Sheets

(56) References Cited

U.S. PATENT DOCUMENTS

| | | |
|---|---|---|
| 2007/0007968 A1 | 1/2007 | Mauney, Jr. et al. |
| 2007/0050159 A1 | 3/2007 | Ewers et al. |
| 2007/0136010 A1 | 6/2007 | Gunn et al. |
| 2009/0309754 A1 | 12/2009 | Bou et al. |

OTHER PUBLICATIONS

Asahi Hall Effect IC Magnetic Sensors; http://www.gmw.com/magnetic_sensors/asahi/hall-effect-ic.html; Nov. 19, 2010; 2 pp.

* cited by examiner

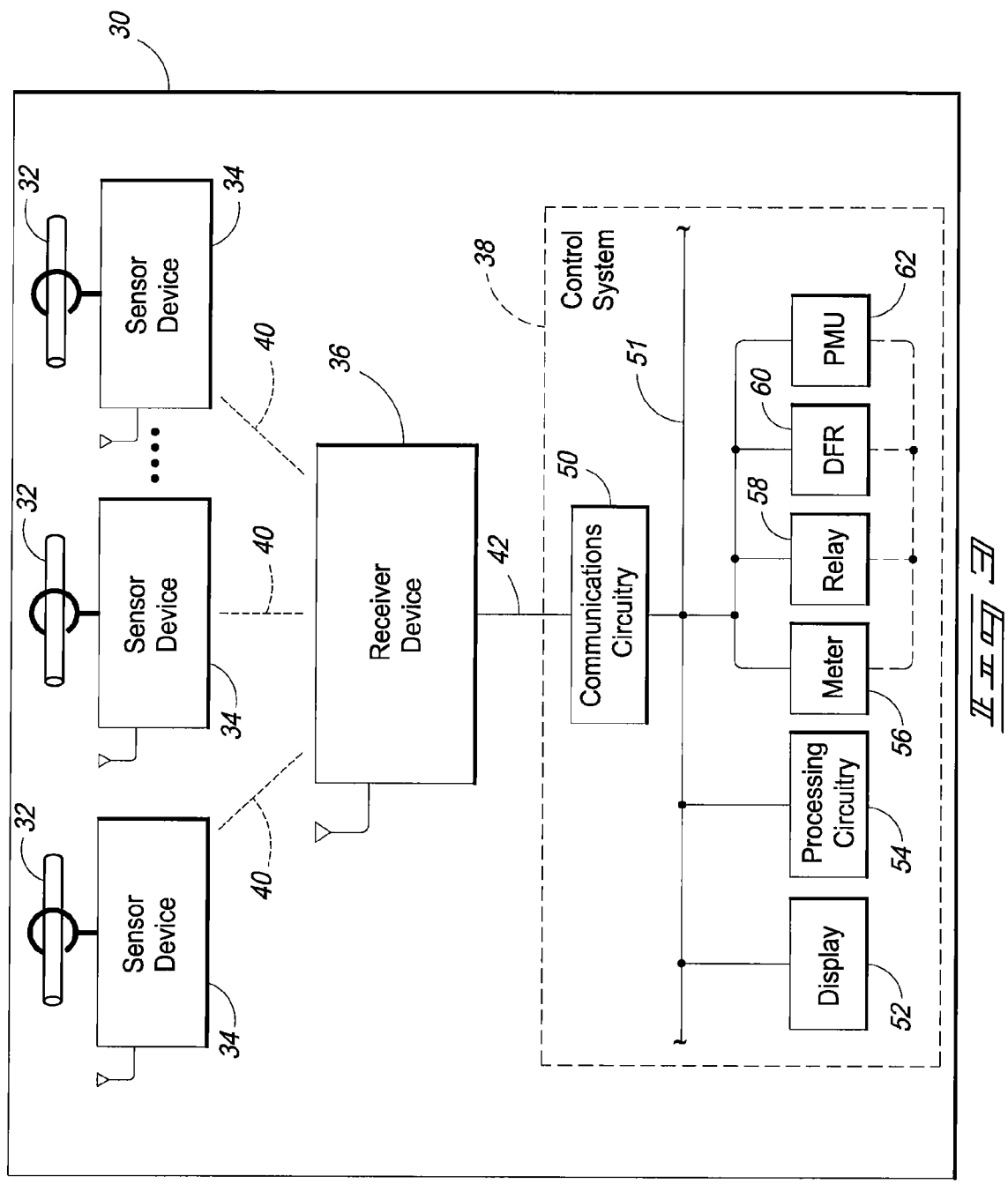

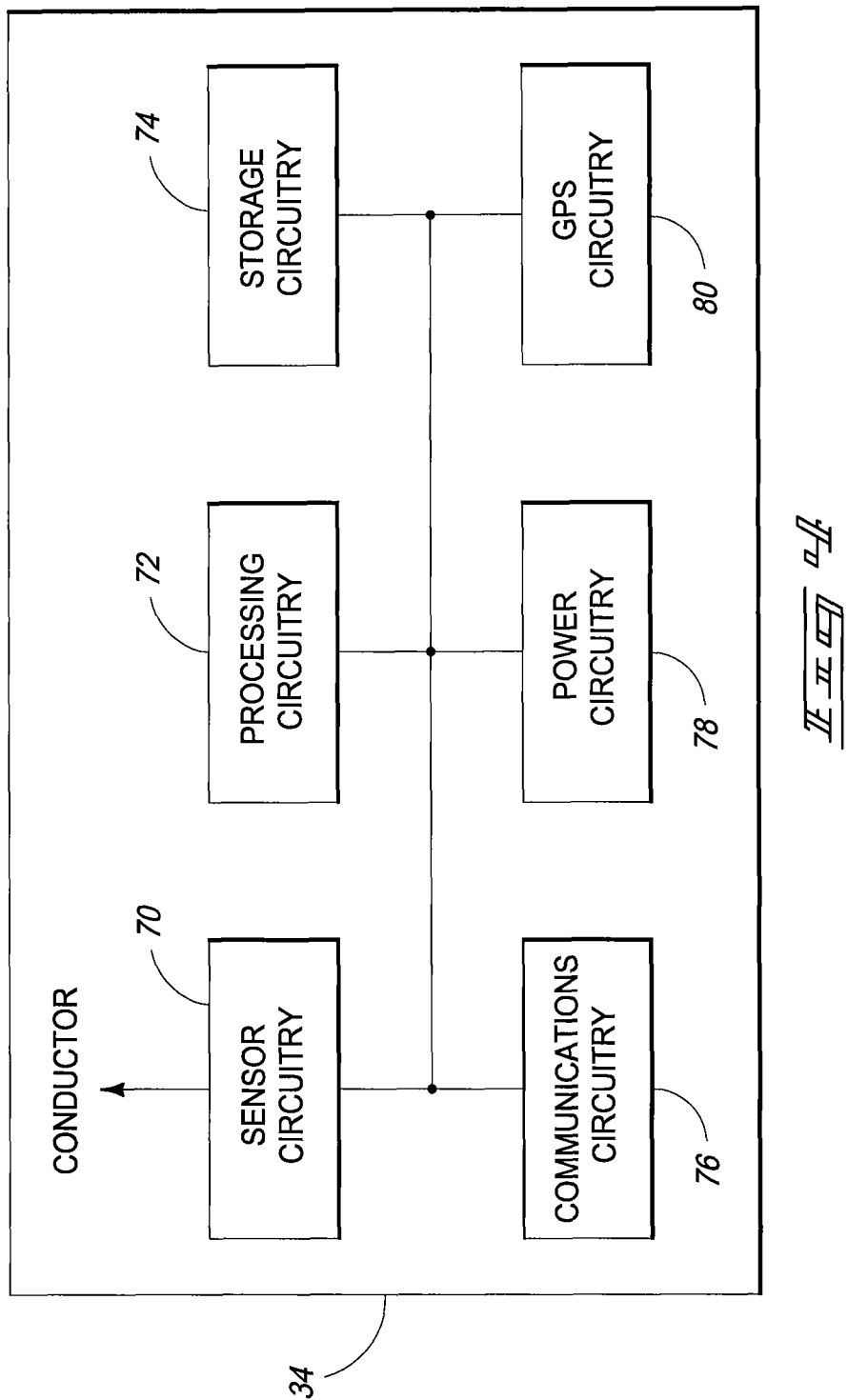

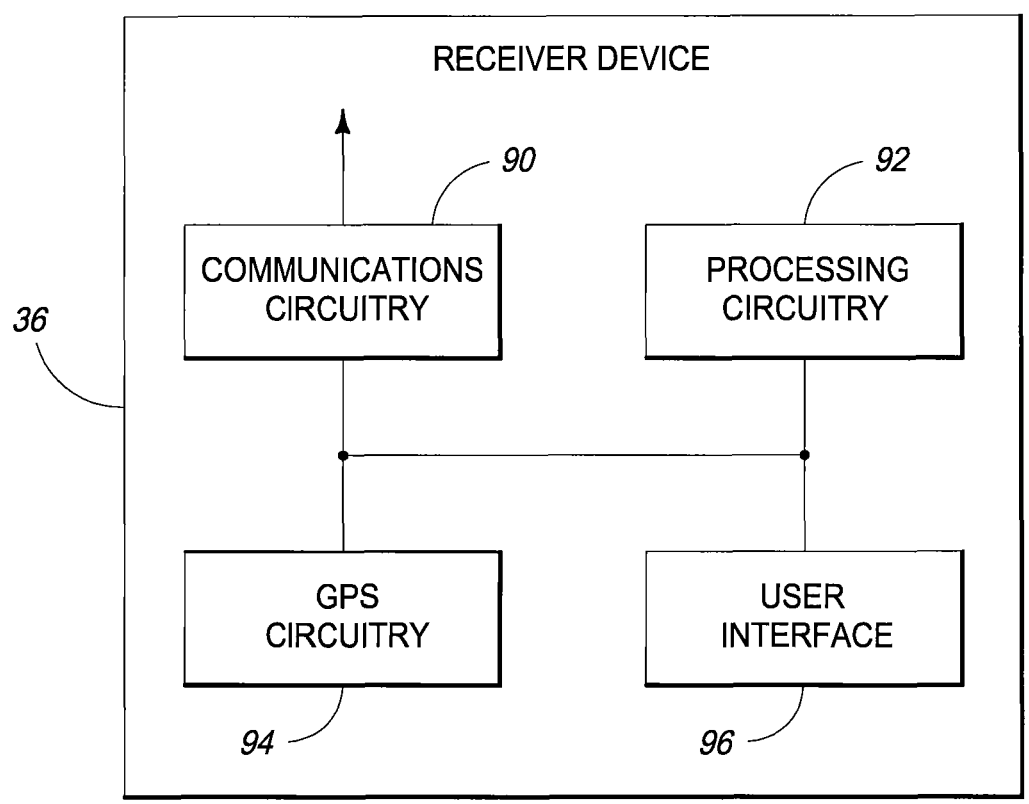

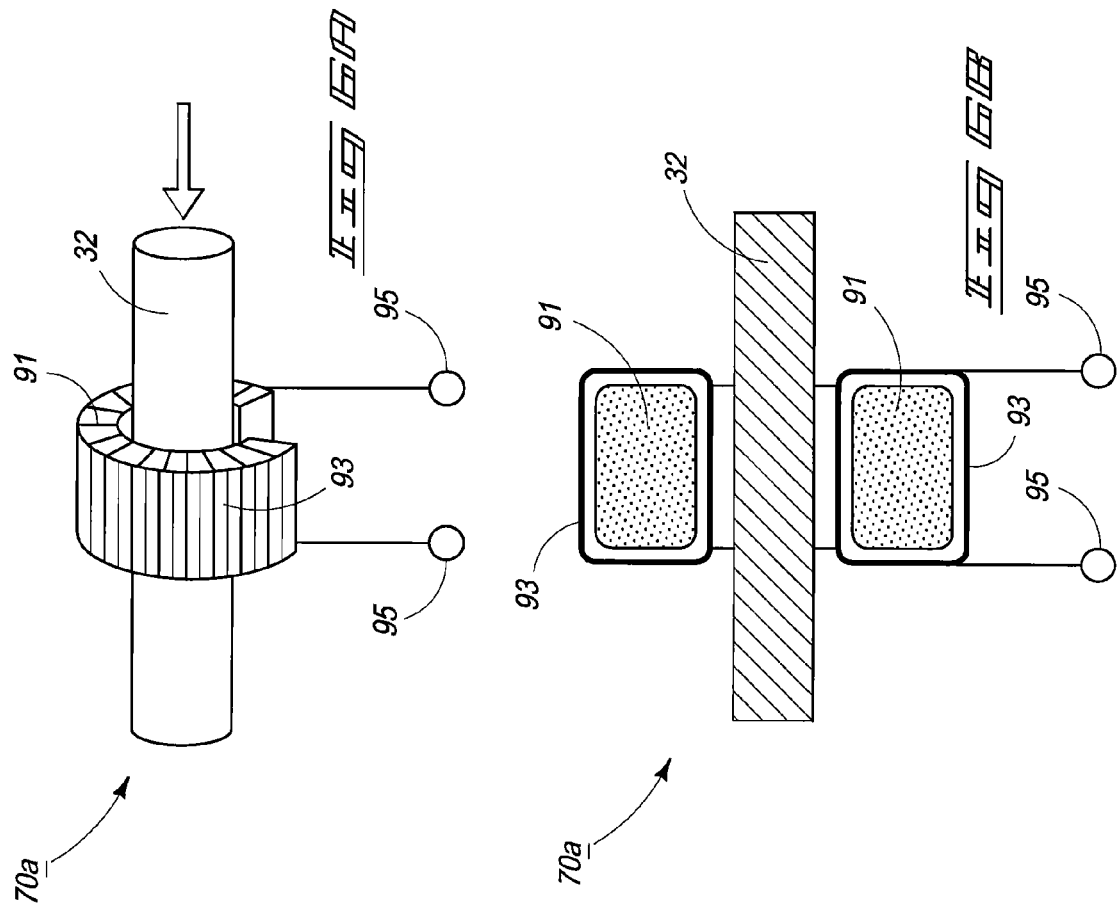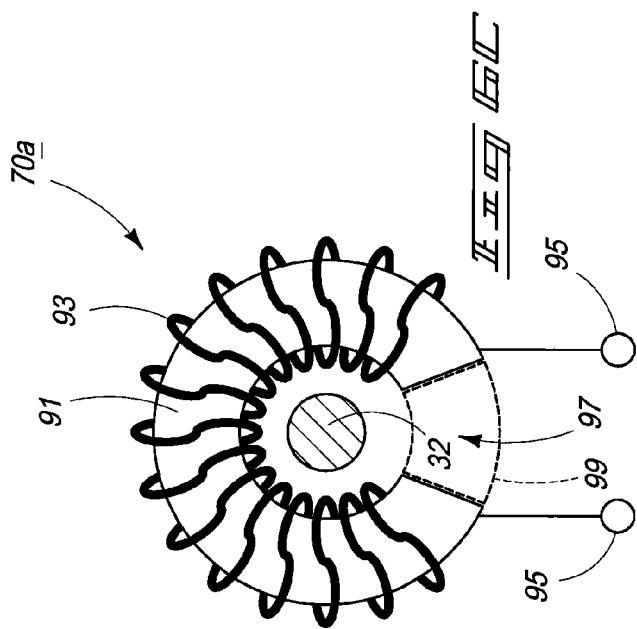

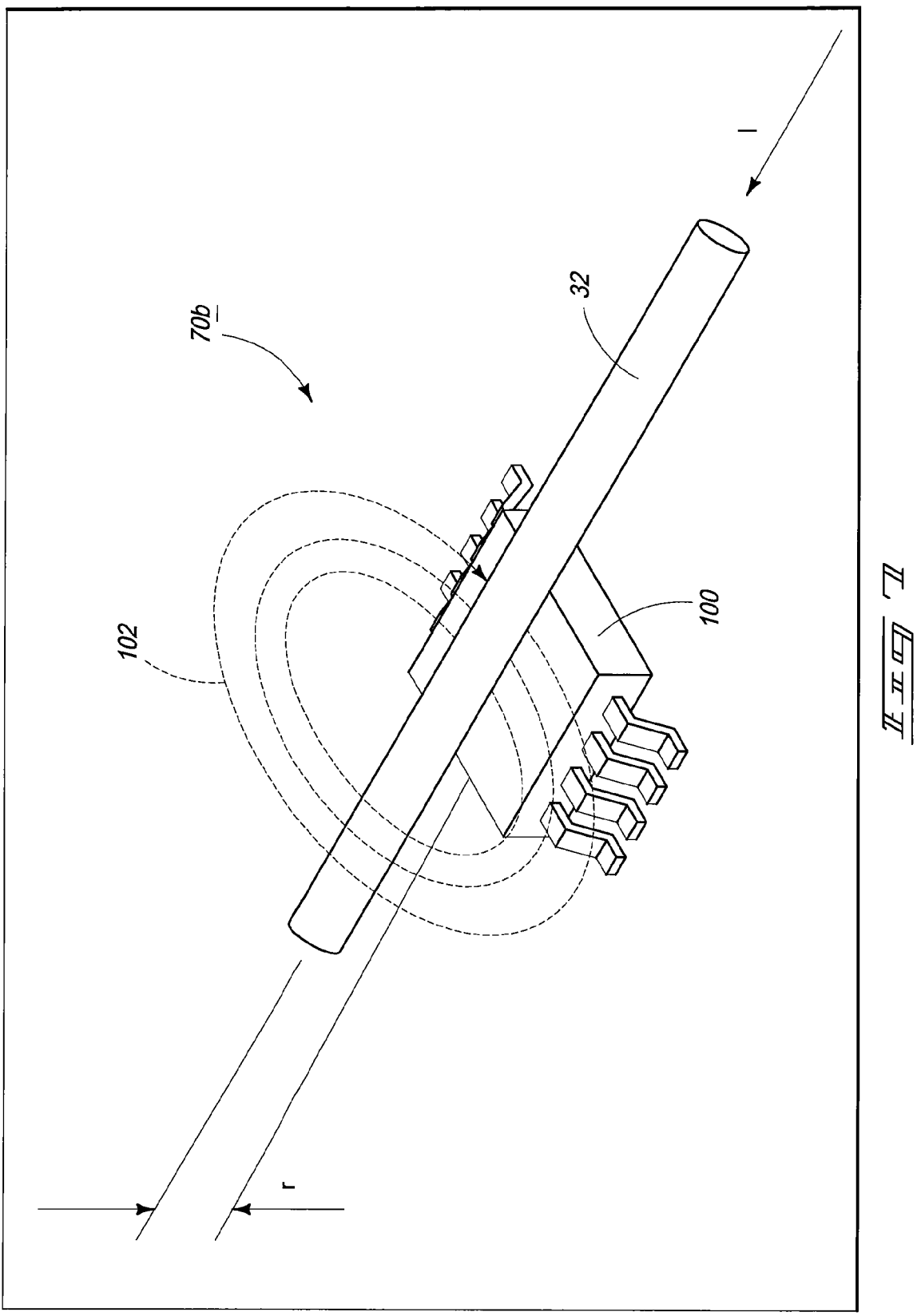

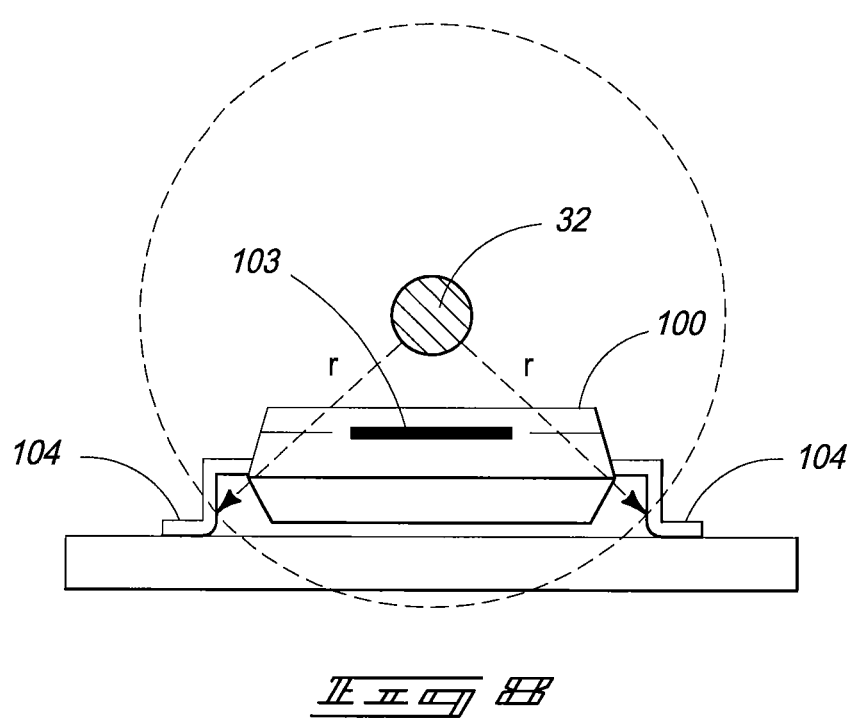

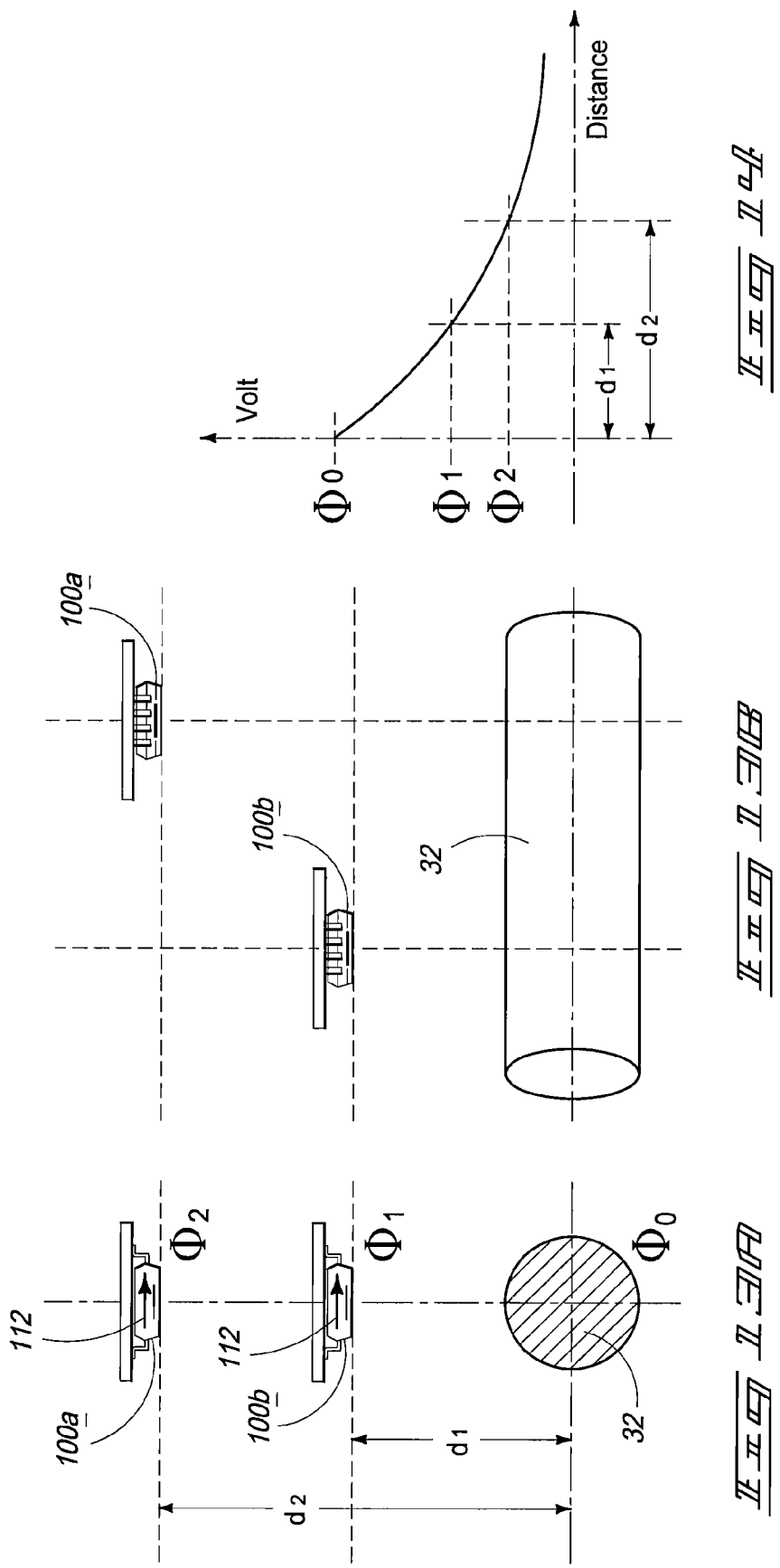

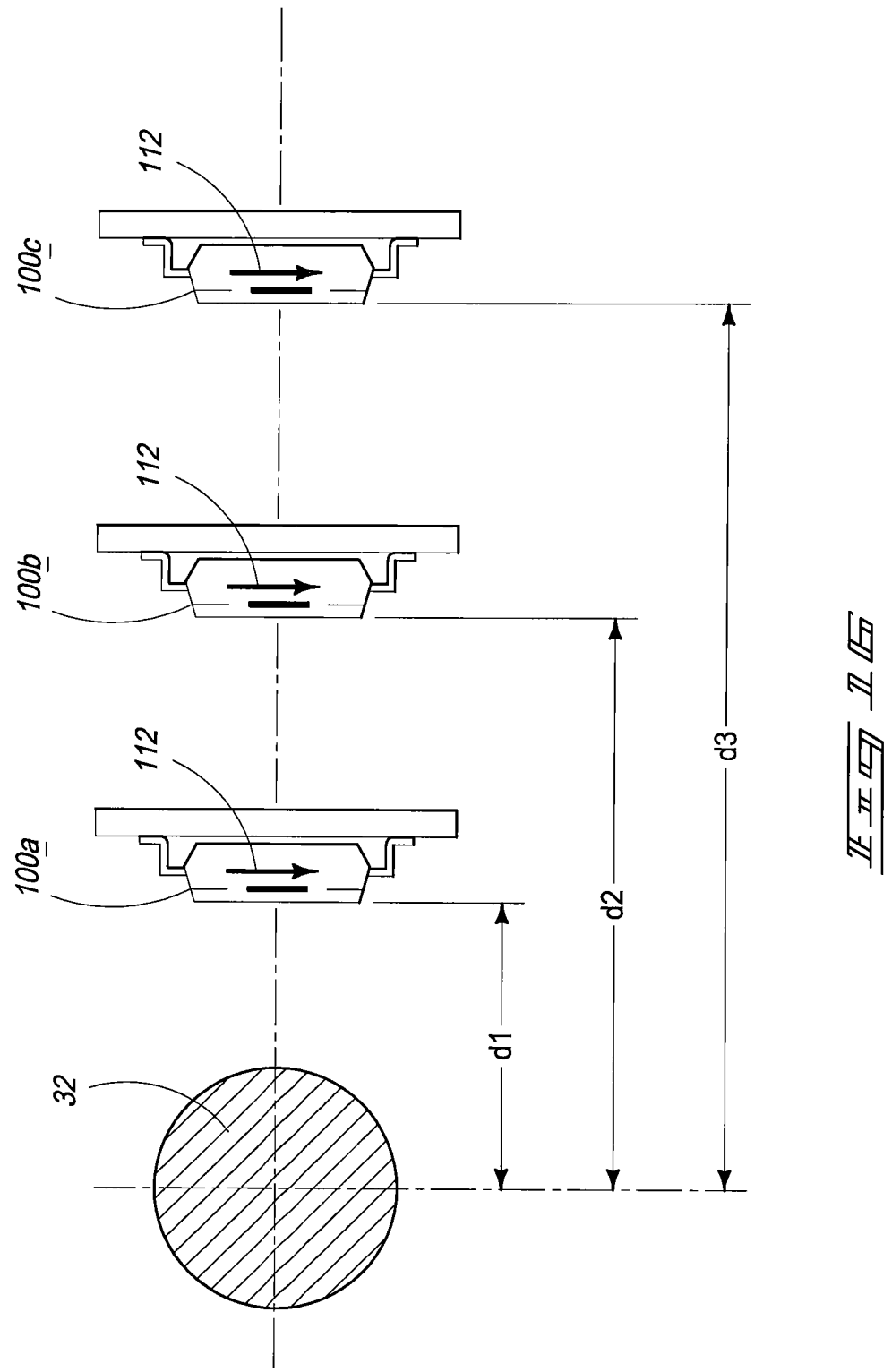

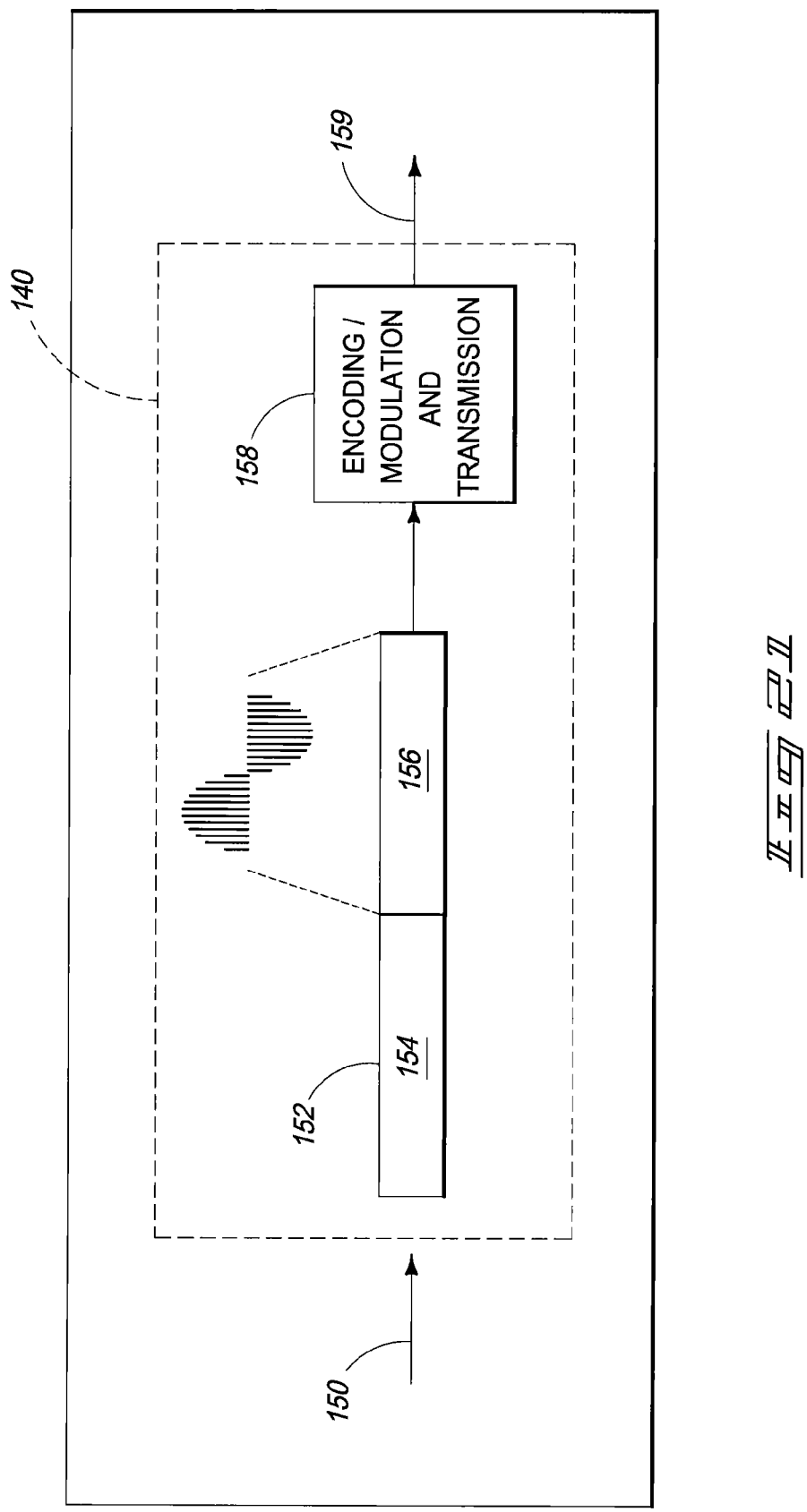

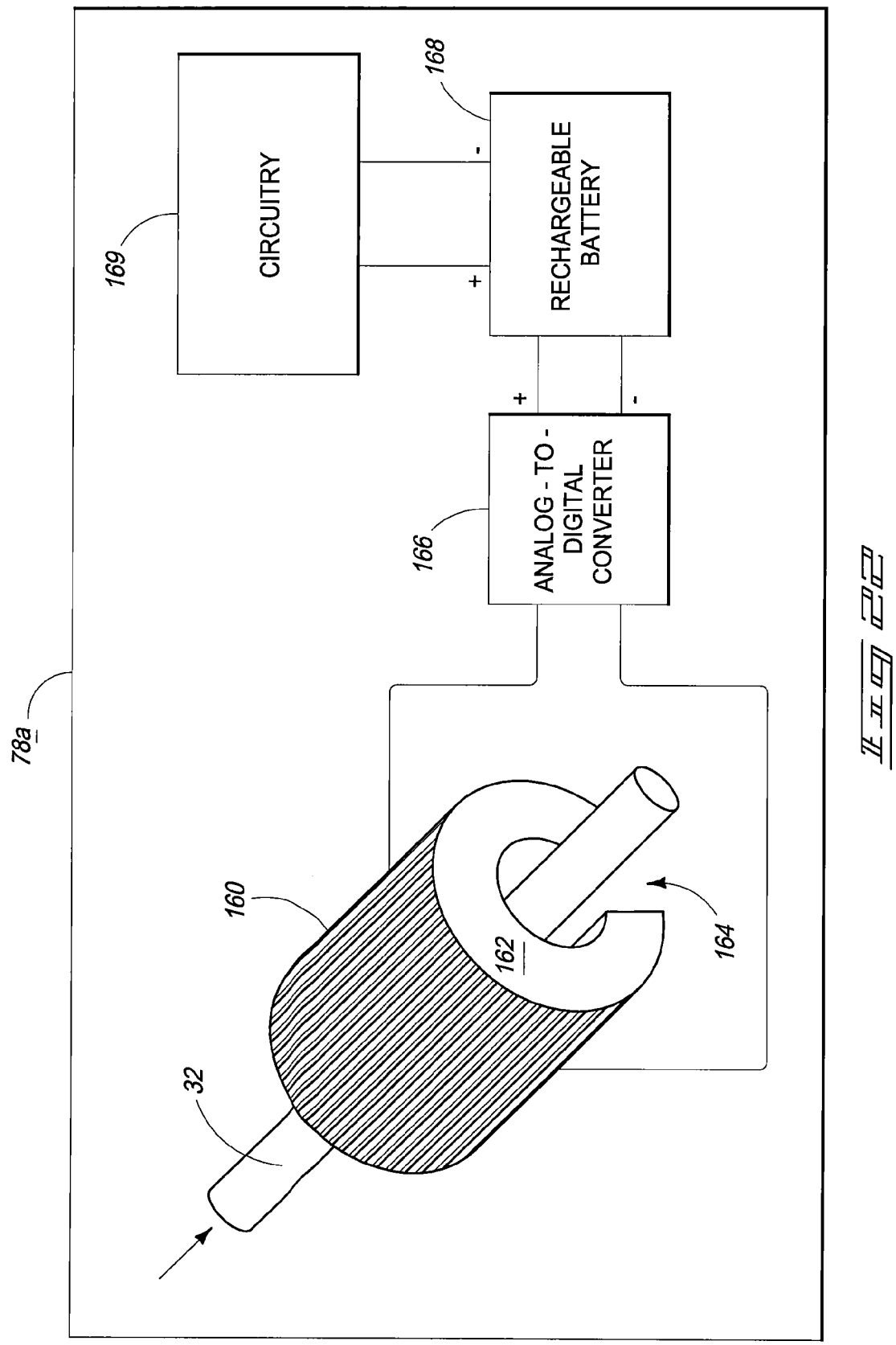

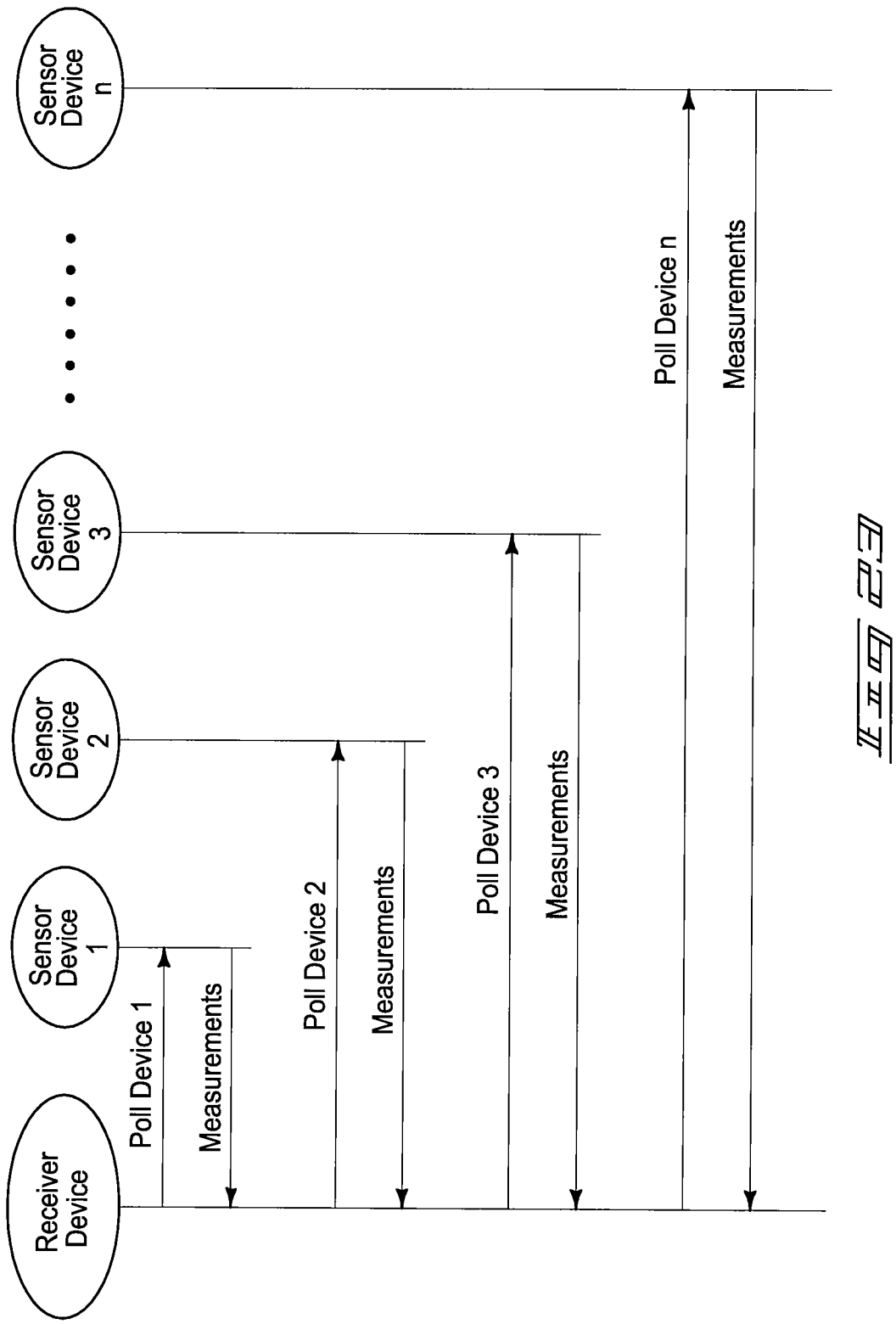

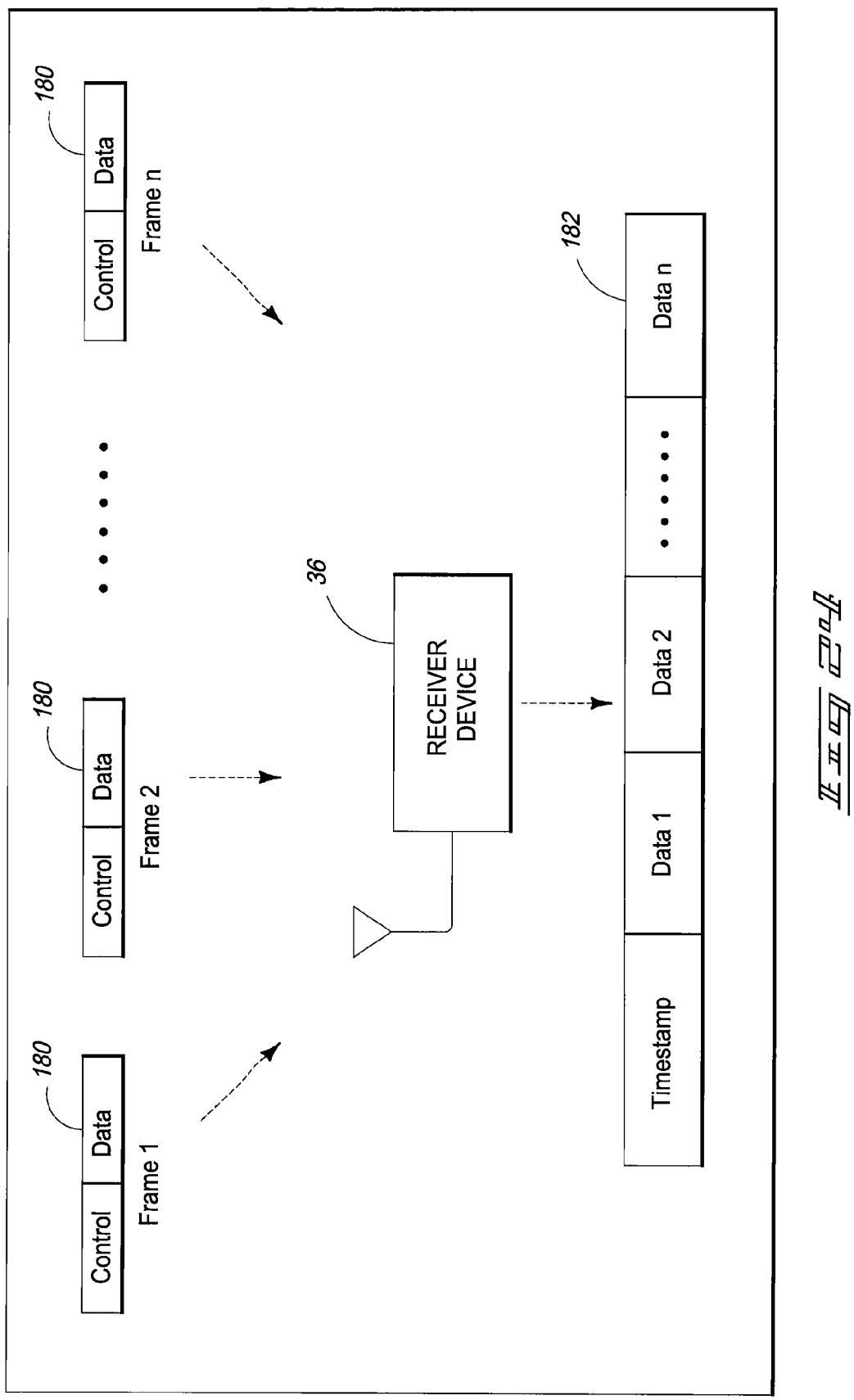

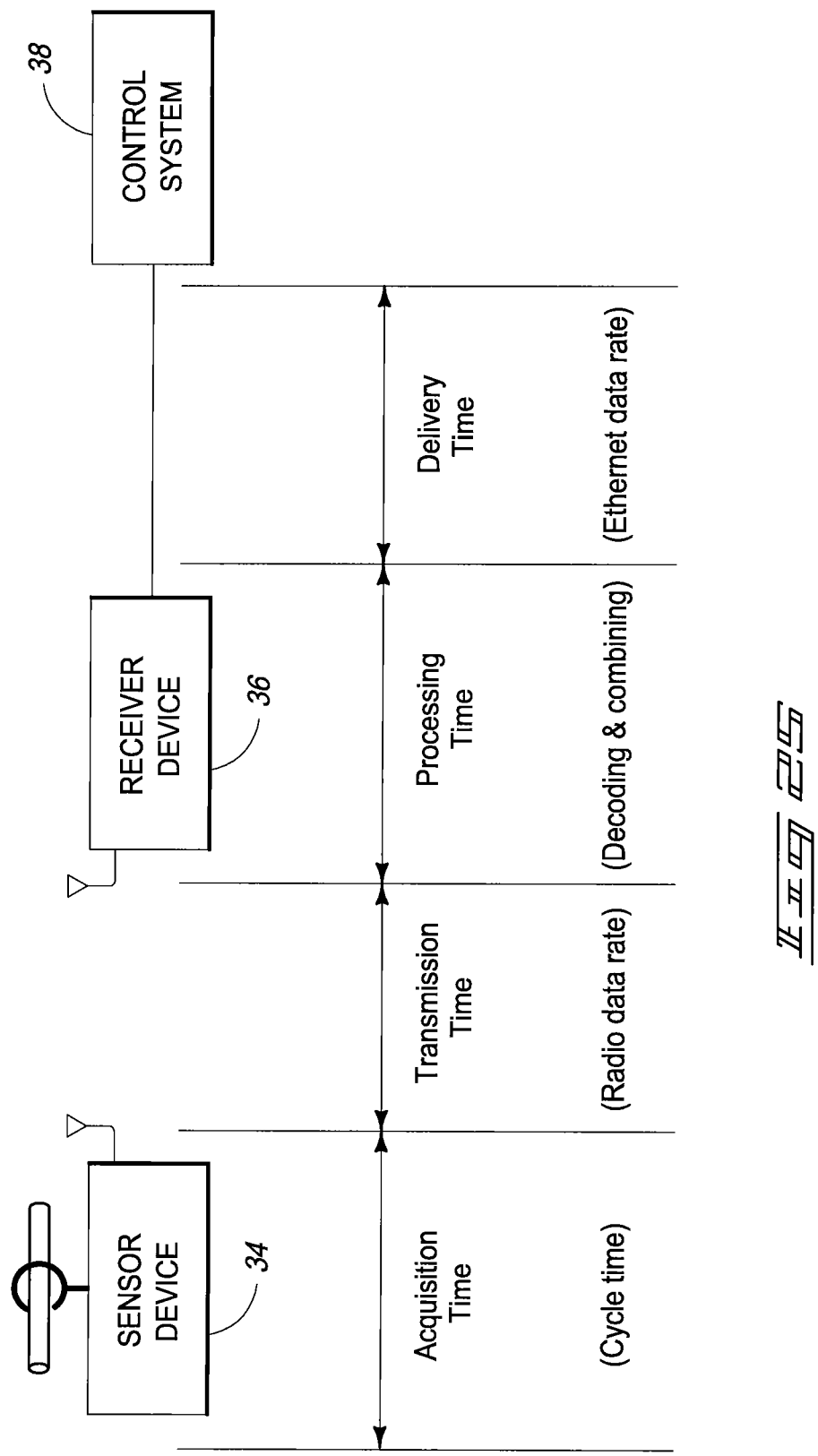

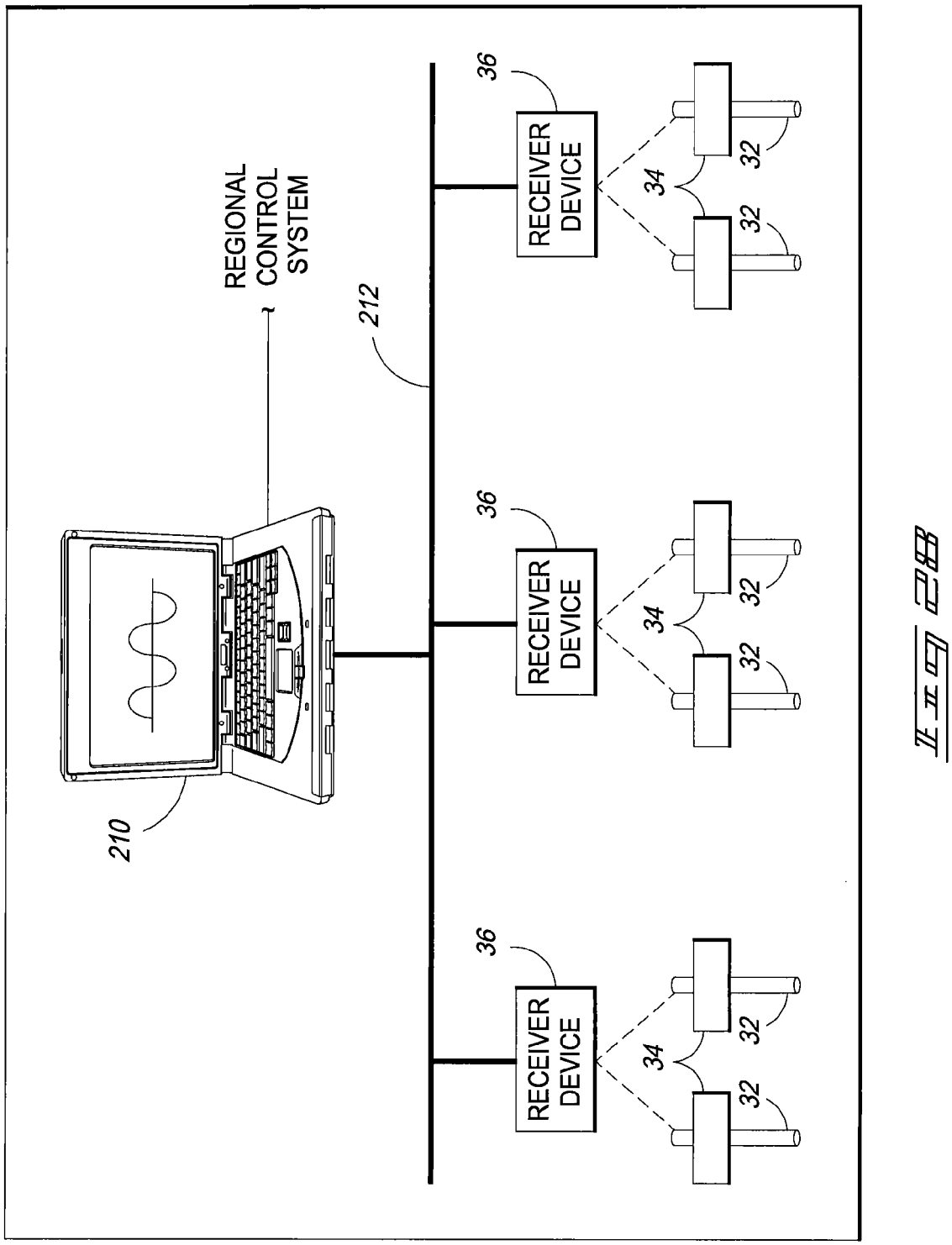

ELECTRICAL POWER SYSTEM SENSOR DEVICES, ELECTRICAL POWER SYSTEM MONITORING METHODS, AND ELECTRICAL POWER SYSTEM MONITORING SYSTEMS

RELATED PATENT DATA

The present application claims priority to U.S. Patent Provisional Application Ser. No. 61/271,189 filed on Jul. 18, 2009, entitled "Disclosure Document for Wireless Current Transformer," the disclosure of which is incorporated herein by reference.

TECHNICAL FIELD

This disclosure relates to electrical power system sensor devices, electrical power system monitoring methods, and electrical power system monitoring systems.

BACKGROUND

Sensors have been used to monitor electrical energy flowing through an electrical power system. For example, traditional current transformers have been used to monitor current flowing through a bus-bar. A traditional current transformer includes a primary winding (coil) and a secondary winding. Energy is coupled between the windings by the time varying magnetic flux that passes through (links) both primary and secondary windings. When current in the primary coil changes, a voltage is induced in the secondary coil by mutual electromagnetic induction.

Referring to FIG. 1, a example conventional current transformer 10 is constructed by passing a single primary turn (a single power line conductor 12) through a well-insulated toroidal core wrapped with many turns of wire (secondary 14). These transformers are typically described by their ratio from primary to secondary and the primary winding is installed in series with the power line conductor 16.

Some current transformers are commonly used in metering and protective relaying in the electrical power industry to facilitate the safe measurement of large currents, often in the presence of high voltages. Insulation voltage of the current transformer represents the maximum insulation provided when connected to a power source. In a high voltage environment, some current transformers utilize significant electrical insulation to isolate the secondary winding 14 from the primary winding 12. Some typical current transformers are relatively large (e.g., measuring about 8×8×20 inches) and typically weigh in excess of 500 lbs. when properly insulated. Accordingly, structures of significant strength and size are used in some arrangements to support the current transformers from solid ground as well as providing electrical isolation. A typical support structure height of a current transformer ranges from 4 feet (e.g., for use in 115 kV applications) to 10 feet (e.g., for use in 500 kV applications) and additional space may be provided between the current transformer structure and other equipments in the installation.

Typical installations include use of insulated wires to transmit output signals of the current transformers (from the secondary winding 14) to other equipment, such as relay blocks and monitoring circuitry within a metering/relay house. Depending on the layout of the installation, a typical signal wire may be a few hundred feet.

As described below, at least some aspects of the present disclosure provide methods and/or apparatus for monitoring one or more characteristic of electrical energy flowing through electrical conductors of an electrical power system.

BRIEF DESCRIPTION OF THE DRAWINGS

FIG. 3 is a functional block diagram of a monitoring and control system according to one embodiment.

FIG. 4 is a functional block diagram of a sensor device according to one embodiment.

FIG. 5 is a functional block diagram of a receiver device according to one embodiment.

FIG. 6 is an illustrative representation of a coil and core of induced circuitry according to one embodiment.

FIG. 7 is an illustrative representation of hall effect circuitry according to one embodiment.

FIG. 8 is an illustrative representation of positioning of hall effect circuitry with respect to a conductor being monitored according to one embodiment.

FIGS. 13a-b are illustrative representations of sensor circuitry including a plurality of hall effect circuits positioned with respect to a common side of a conductor being monitored according to one embodiment.

FIG. 14 is a graphical representation of the output of a hall effect circuit as a function of distance from a conductor being monitored according to one embodiment.

FIG. 16 is an illustrative representation of a plurality of sensor devices located adjacent to one side of a conductor being monitored according to one embodiment.

FIG. 17 is a graphical representation of distance versus current for different distances of a sensor device from the conductor being monitored according to one embodiment.

FIG. 22 is an illustrative representation of power circuitry of a sensor device according to one embodiment.

FIG. 23 is an illustrative representation of a polling communications arrangement according to one embodiment.

FIG. 24 is an illustrative representation of generation of a superframe according to one embodiment.

FIG. 25 is an illustrative representation of time latency of operations with respect to monitoring operations according to one embodiment.

FIG. 28 is an illustrative representation of a substation configuration according to one embodiment.

DETAILED DESCRIPTION

At least some aspects of the disclosure include methods, systems and sensors for monitoring electrical characteristics of electrical energy flowing through one or more conductors of an electrical power system. In one embodiment, the sensors which are configured to monitor the characteristics are electrically isolated from the electrical conductors being monitored as well as electrically insulated from Earth ground and other external ground references. In another embodiment, a plurality of sensor circuits are located adjacent to one or more location of the electrical conductor to implement monitoring operations of the electrical energy flowing through the conductor. In yet another embodiment, the sensors are configured to wirelessly communicate with a remote receiver device which is arranged to process information received from the sensors. In one embodiment described below, a common timing reference may be established between the plurality of sensors to provide time-synchronized information regarding time-varying electrical signals. An additional embodiment discloses a hall effect device which is configured to measure current in electrical conductors carrying high voltage electrical energy (e.g., electrical energy in a range of 600 V to 800 KV in one example). Additional embodiments and additional details of the above-mentioned example arrangements are described in detail below.

Figure 1:
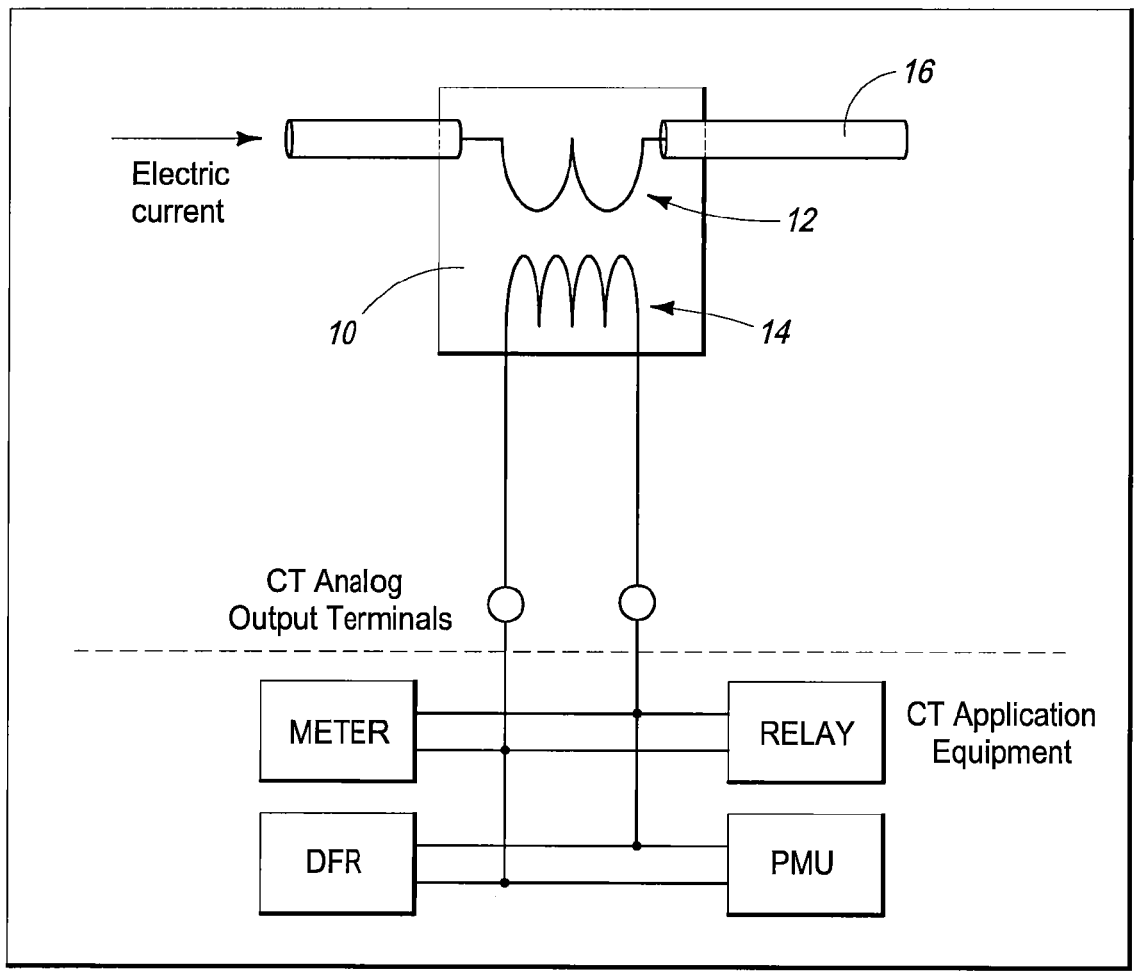
FIG. 1 is a functional block diagram of a system which utilizes a conventional current transformer.
Figure 2:
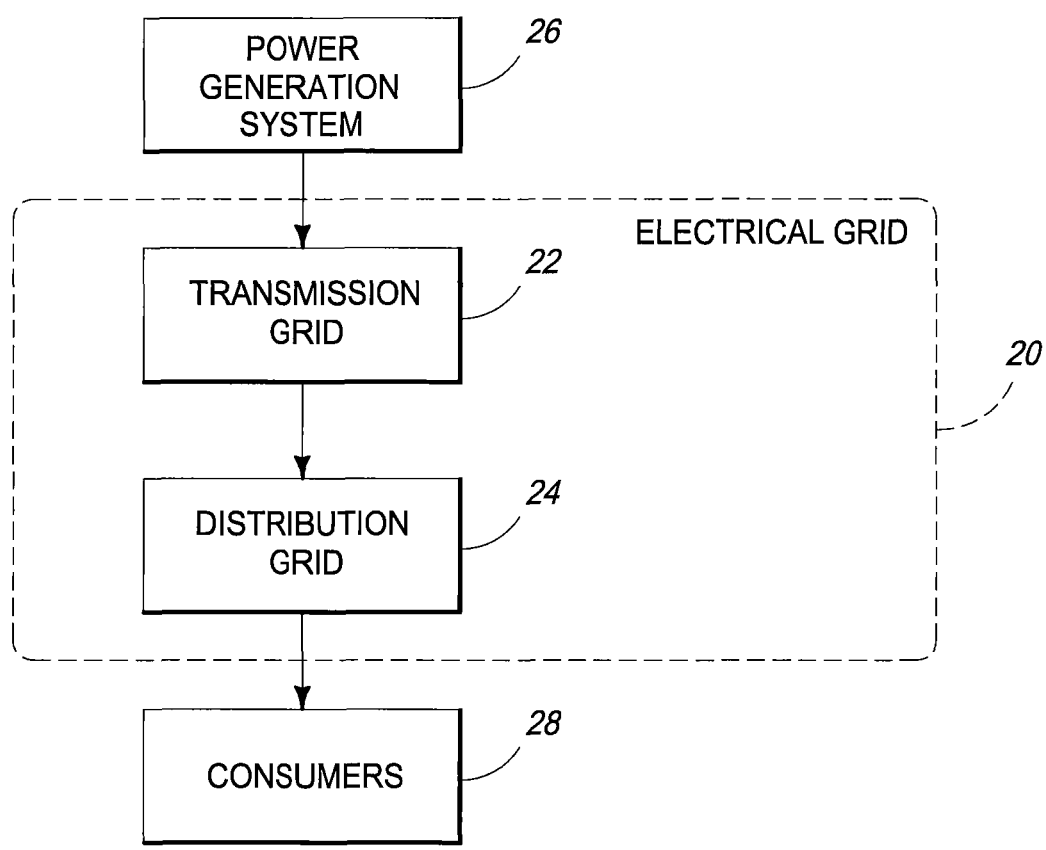
FIG. 2 is a functional block diagram of an electrical system which includes an electrical grid in one embodiment.

Referring to FIG. 2, an electrical power system including an electrical grid 20 which includes a transmission grid 22 and distribution grid 24 is shown in one example embodiment. The transmission and distribution grids 22, 24 of the electrical grid 20 include a network of electrical conductors which transmit and distribute electrical energy generated by power generation systems 26 to loads of consumers 28 where the electrical energy is utilized. Example power generation systems 26 include coal plants, nuclear plants, hydro-electric plants, solar farms, and wind farms. Example consumers 28 include industrial factories, residential neighborhoods, farms, and other entities which consume electrical energy.

In this example disclosed implementation, the disclosed methods, systems and sensors monitor electrical energy flowing within electrical grid 20. In more specific examples, the disclosed methods, systems and sensors may monitor electrical energy flowing within conductors (e.g., bus-bars) of transmission grid 22 and/or distribution grid 24 of the electrical grid 20 and may monitor extra high voltage energy (e.g., >265 kV), high voltage energy (e.g., 110 kV~265 kV) or low voltage electrical energy (e.g., <110 kV). In some examples, the electrical energy being monitored may be 1-132 KV (distribution) or 345-800 KV (transmission). Some of the conductors of the electrical grid 20 conduct electrical energy over significant distances between remote geographical locations (e.g., between different states). The disclosed methods, systems and sensors may be used to monitor other conductors which are utilized in other implementations in other embodiments.

The disclosed embodiments provide practical, accurate and efficient information regarding the monitored electrical energy which may be used by many industries including the power transmission and protection industries, for example, to monitor the dynamic nature of the electrical grid 20 and implement protection operations to prevent failures. The information provided as a result of the monitoring may be used to control operations of the electrical grid 20 and may be useful to avoid, reduce or otherwise control conditions which may damage the grid (e.g., black-outs). In one embodiment, the information may be used in concepts such as Wide Area Measurement Systems (WAMS) in efforts to protect the electrical grid 20 from black-out situations. Supervisory Control and Data Acquisition (SCADA) systems may utilize the generated information to control operations with respect to the electrical grid 20 in one additional example (e.g., implementing power system detection and prevention).

Referring to FIG. 3, an example embodiment of a monitoring and control system 30 is illustrated in one embodiment. System 30 is configured to monitor one or more conductors 32 of the electrical grid 20 and control operations with respect to the electrical grid 20 in one embodiment. Other configurations of system 30 are possible in other embodiments.

The illustrated system 30 of the depicted example embodiment includes a plurality of sensor devices 34, a receiver device 36, and a control system 38. Other arrangements are possible, for example, additional sensor devices 34 may be provided which are arranged to communicate with the illustrated receiver device 36 or additional receiver devices 36 may also be included.

In one example operational embodiment, sensor devices 34 are arranged to monitor one or more electrical characteristic of one or more electrical conductors 32. A plurality of the sensor devices 34 may monitor the same or different electrical conductors 32 in one embodiment. The sensor devices 34 are arranged to communicate data (e.g., measurement data regarding sensed electrical characteristics of the electrical energy flowing in the respective conductors 32) to the receiver device 36 in one implementation. For example, the sensor devices 34 may implement wireless communications 40 with receiver device 36 in but one arrangement.

Receiver device 36 receives the data from the sensor devices 34, combines the data and communicates the data to a control system 38 in one embodiment. In one embodiment, the receiver device 36 communicates the data via a fiber optic cable 42 or other suitable communications system to control system 38.

In addition, receiver device 36 coordinates at least one operation of the sensor devices 34 with respect to the monitoring and collection of the measurement data for the monitored electrical characteristic. For example, the receiver device 36 may coordinate communications of the sensor devices 34 with respect to the receiver device 36 as well as coordinate the timing in which samples are obtained by a plurality of sensor devices 34 and/or sensor circuits thereof in some example embodiments.

In example embodiments described below, receiver device 36 may communicate a timing reference to the sensor devices 34 and the sensor devices 34 may utilize the timing reference to adjust their internal clocks. The timing references of the sensor devices 34 may be used to control when samples of the generated data signals of the characteristic of the electrical energy are obtained. For example, in one embodiment, it is desired to synchronize the sensor devices 34 to obtain their respective samples at a plurality of common moments in time which provides data regarding the electrical energy being conducted using the conductor which may be an AC time-varying waveform in one example. In one embodiment, the sensor devices 34 obtain a plurality of samples at a plurality of moments in time according to a given interval and the samplings by the sensor devices 34 (and sensor circuits 70 therein) may be taken according to the common interval which is synchronized to a common timing reference established by the receiver device 36 in one embodiment. The sampling by the sensor devices 34 at a plurality of common moments in time provides information regarding a time-varying signal at a plurality of different locations of one or more conductor 32 according to example embodiments described herein. The receiver device 36 may provide the common timing reference to the sensor devices 34 in one embodiment, or the sensor devices 34 and receiver device 36 may utilize a common, independent timing reference (e.g., GPS) for common timing in another embodiment.

In addition, as mentioned above, the receiver device 36 may control synchronization of the communications of the measurement data from the sensor devices 34 to the receiver device 36 in one embodiment. For example, multiple sensor devices 34 may generate simultaneous wireless communications which may result in collisions if they are not synchronized. Additional details are described below according to one embodiment where the receiver device 36 synchronizes the communications from the sensor devices 34 to reduce or eliminate the occurrence of collisions which may delay detection of fault conditions within the electrical system being monitored.

Control system 38 may use the data to monitor the electrical energy flowing within the electrical conductors 32 of the electrical system being monitored (e.g., electrical grid 20) and control operations of the electrical system in one embodiment. In the illustrated example embodiment, control system 38 includes communications circuitry 50 arranged to receive the data outputted from receiver device 36 and output the data via a local area network 51 or other suitable communications infrastructure. The network 51 communicates the data to end user equipment and may include Ethernet, WiFi, or optical interconnections in illustrative examples. Routers, hubs and switches may also be used to implement communications within the control system 38 in another embodiment. The data may be communicated to processing circuitry 54 and other end user equipment including a power meter 56, relay 58, digital fault recorder (DFR) 60 and/or phase measurement unit (PMU) 62 in the depicted example embodiment. The end user equipment may use the measurement data obtained by the sensor devices 34 to monitor the electrical system and implement operations with respect to the electrical system, for example, to protect the electrical system from overload conditions (e.g., open a relay if the current exceeds a threshold). Communications circuitry 50 may also communicate with analog systems (e.g., conventional current transformers) via appropriate digital/analog conversion circuitry in one embodiment. Digitized measurement data obtained by the sensor devices 34 in one possible arrangement may be converted to analog data for interfacing with existing analog end user equipment if desired. Accordingly, in example embodiments, the digitized measurement data may be processed directly using digital end user equipment 56, 58, 60 and/or 62 or converted to analog data for use with analog end user equipment 56, 58, 60 and/or 62.

Control system 38 further includes a display 52 which is configured to display the received data indicative of current statuses of the electrical system being monitored as well as display other information, such as alarms. The data may be represented in analog or digital diagrams with time and geographical indications of the data of the conductors 32 being monitored in one embodiment.

Processing circuitry 54 is configured to process the received data and to control the display to depict the data, generate alarms (e.g., if a monitored characteristic such as electrical current exceeds a threshold), control data access and storage (using storage circuitry—not shown), issue commands, and control other operations of control system 38. In one example, processing circuitry 54 provides substantially real-time detection and monitoring with a delay of approximately 1-3 cycles of the signal being monitored.

Processing circuitry 54 may comprise circuitry configured to implement desired programming provided by appropriate computer-readable storage media in at least one embodiment. For example, the processing circuitry 54 may be implemented as one or more processor(s) and/or other structure configured to execute executable instructions including, for example, software and/or firmware instructions. Other exemplary embodiments of processing circuitry 54 include hardware logic, PGA, FPGA, ASIC, state machines, and/or other structures alone or in combination with one or more processor(s). Processing circuitry 54 may include circuitry of a powerful workstation, server or series of workstations in example configurations. These examples of processing circuitry 54 are for illustration and other configurations are possible.

Referring to FIG. 4, one example embodiment of the sensor device 34 is shown. The illustrated example sensor device 34 includes sensor circuitry 70, processing circuitry 72, storage circuitry 74, communications circuitry 76, power circuitry 78 and GPS circuitry 80 in one embodiment. Other configurations are possible including more, less and/or alternative components.

Sensor circuitry 70 comprises a transducer configured to monitor an electrical characteristic of electrical energy flowing through an electrical conductor in one embodiment. In illustrative examples described below, the sensor circuitry 70 monitors current flowing through the electrical conductor. Example current monitoring sensor circuitry 70 which may be utilized monitors the magnitude of an electromagnetic field (EMF) about the conductor 32 and which is indicative of current flowing within the conductor 32. The sensor circuitry 70 generates data signals including analog measurement data (e.g., voltages) which correspond to the amplitude of the sensed electromagnetic field and may be used to determine electrical current flowing through the conductor 32 in one embodiment. Example configurations of sensor circuitry 70 are described below and may include an induced configuration which includes a winding and core about the electrical conductor in one example embodiment or hall effect circuitry in another example embodiment.

In some arrangements, a single sensor device 34 may include a plurality of sensor circuits 70 which may be positioned at different axial locations along the conductor 32 and/or different distances from the electrical conductor 32 as described in further detail in illustrative embodiments below. The different sensor circuits 70 are configured to provide information regarding the characteristic according to different aspects in some example embodiments. For example, the circuits 70 may be positioned at different axial positions along the conductor 32 being monitored or at different distances from the conductor 32 being monitored (enabling different ranges of intensities or strengths of an electromagnetic field to be monitored) in example embodiments.

Processing circuitry 72 may be configured as described above in the control system embodiment. Processing circuitry 72 is configured to access data regarding the electrical characteristic of the electrical energy from the sensor circuitry 70. Processing circuitry 72 may be configured to implement analog-to-digital conversion operations to provide a digital representation of an AC current waveform. Measurement data of the generated analog signals and which are indicative of the monitored characteristic may be sampled during analog-todigital conversion operations providing a plurality of samples of the measurement data. The processing circuitry 72 may be configured to process the data (e.g., change the format of the data, filter the data, calculate phasors of a current waveform) in some implementations. The processing circuitry 72 may control the communications of the data externally of the sensor device 34 using the communications circuitry 76, for example, to receiver device 36.

Storage circuitry 74 is configured to store programming such as executable code or instructions (e.g., software and/or firmware), data generated by the sensor circuitry 70, databases, configuration data determined during installation of device 34 and calibration data (e.g., electromagnetic gains, position offsets, linear factors) determined during an inspection process of device 34 or other digital information and may include computer-readable storage media. At least some embodiments or aspects described herein may be implemented using programming stored within one or more computer-readable storage medium of storage circuitry 74 and configured to control appropriate processing circuitry 72.

The computer-readable storage medium may be embodied in one or more articles of manufacture which can contain, store, or maintain programming, data and/or digital information for use by or in connection with an instruction execution system including processing circuitry 72 in the exemplary embodiment. For example, exemplary computer-readable storage media may include any one of physical media such as electronic, magnetic, optical, electromagnetic, infrared or semiconductor media. Some more specific examples of computer-readable storage media include, but are not limited to, a portable magnetic computer diskette, such as a floppy diskette, a zip disk, a hard drive, random access memory, read only memory, flash memory, cache memory, and/or other configurations capable of storing programming, data, or other digital information.

Communications circuitry 76 is configured to implement communications externally of the sensor device 34. For example, sensor device 34 is typically located in proximity to an electrical conductor 32 being monitored (e.g., a high voltage power line of the electrical grid 20). The receiver device 36 may be remotely located with respect to a plurality of sensor devices 34 and the communications circuitry 76 is arranged to communicate measurement data provided by the sensor circuitry 70 to the receiver device 36. Communications circuitry 76 may be arranged to communicate the data using different media (e.g., wireless electromagnetic signals, wired electrical conductors, or optical fiber) in different embodiments. Wireless communications may be utilized in some embodiments wherein the sensor device 34 is electrically insulated from other electrical conductors.

In the illustrated embodiment, the sensor device 34 includes power circuitry 78 which is configured to provide operational electrical energy to the circuitry of the sensor device 34. As described in below in one embodiment, the power circuitry 78 generates the electrical energy without electrical connection to any external conductors (e.g., the power circuitry 78 is electrically isolated from the electrical conductor being monitored and other external conductors). In some example configurations described below, power circuitry 78 may be implemented as a battery, photovoltaic circuitry, induction circuitry to generate electrical energy from the electromagnetic field induced by the electrical energy flowing through the conductor, or an arrangement configured to generate operational energy from received wireless energy. Accordingly, in some embodiments, the operational electrical energy is provided for use within the device 34 without electrical connection to any conductors which are external of the sensor device 34.

GPS circuitry 80 is arranged to receive GPS signals from the GPS satellite constellation. These signals include a common timing reference, and accordingly, the sensors devices 34 and receiver device 36 may be synchronized with respect to one another using a common timing reference. Utilization of the common timing reference enables monitoring of one or more dynamically varying waveforms at a plurality of different locations upon the electrical grid 20 and the results of the monitoring by the plurality of sensor 34 devices is referenced to the common timing reference. In one embodiment, the processing circuitry 72 may use the common timing reference to control when samples of measurement data are generated as well as timestamp the measurement data regarding the monitored electrical characteristic of the electrical energy for use in subsequent processing. Furthermore, the common timing reference may also be used to synchronize communications of measurement data to receiver device 36 which may also include respective GPS circuitry in one embodiment.

In addition, the GPS circuitry 80 may also provide location information regarding the location of the sensor device 34 when the measurement data was generated and the location information may be associated with the generated measurement data. The timestamp and geographical information may be communicated to the receiver device 36 along with the measurement data in one embodiment.

In some embodiments, the GPS circuitry 80 may be omitted from the sensor device 34 and the receiver device 36 may be utilized to establish a common timing reference for use by devices 34, 36.

As discussed above in some example embodiments of the sensor device 34, power circuitry 78 is not electrically connected with any electrical conductors which are external of the sensor device 34, and accordingly, the power circuitry 78 is electrically insulated from the external conductors (e.g., the electrical conductor being monitored, Earth ground, etc.) in these example embodiments.

In other example embodiments of the sensor device 34, all of the circuitry of the sensor device 34 is electrically isolated from all electrical conductors which are external of the sensor device 34. In these embodiments, the sensor device 34 is electrically insulated and all of the circuitry of the sensor device 34 is electrically insulated from the electrical conductor 32 being monitored, Earth ground, other ground references, etc. For example, in one embodiment, communications circuitry 76 includes wireless communications circuitry which is configured to implement communications with respect to other devices which are external of the sensor device 34 without use of an electrical conductor to the external devices.

Referring to FIG. 5, one embodiment of a receiver device 36 is shown. The illustrated configuration of the receiver device 36 includes communications circuitry 90, processing circuitry 92, GPS circuitry 94 and a user interface 96. Other embodiments are possible including more, less and/or alternative components.

Communications circuitry 90 may be configured similar to the communications circuitry 76 of the sensor device 34. For example, the communications circuitry 90 may be configured to implement communications with respect to external devices, for example using wired electrical, optical, or electromagnetic (wireless) signals. In one more specific embodiment, the communications circuitry 76 is arranged to implement wireless communications with respect to the communications circuitry 76 of a plurality of sensor devices 34 without use of any electrical connection to the sensor devices 34. In addition, the communications circuitry 90 may also implement communications with respect to a control system 38 using electrical or optical conductors in example embodiments. Optical configurations may communicate the data over relatively large distances (e.g., one or more miles) with little or negligible time delays.

Processing circuitry 92 is configured to control communications and packaging of data and may be configured similarly to the processing circuitry 72 of the sensor device 34 in one embodiment. In one embodiment, the processing circuitry 92 decodes the measurement data and includes a combiner which combines the measurement data from a plurality of the sensor devices 34 into a composite signal. In one example, the processing circuitry 92 combines the measurement data from a plurality of the sensor devices 34 having a common timestamp into a common group (e.g., superframe) for communication to control system 38 for monitoring and analysis purposes. Accordingly, in one embodiment, each superframe includes measurement data from a plurality of sensor devices 34 and which correspond to a respective common moment in time when the measurements were obtained. The processing circuitry 92 may also associate geographical data (e.g., corresponding to the locations of the sensor devices 34 which communicated the measurement data) with the respective measurement data. The measurement data may be communicated by the receiver device 36 to the control system 38 after the combination operations in one illustrative example. Accordingly, in one embodiment, a plurality of superframes may be generated and communicated which individually include measurement data obtained at a plurality of respective moments in time. Processing circuitry 92 may gather management information, such as operation statistics (e.g., measurement data regarding observed currents), from sensor devices 34 and organize and communicate the information to external devices such as to control system 210 discussed in FIG. 28.

GPS circuitry 94 may be configured similarly to GPS circuitry 80 of the sensor device 34 to provide a common timing reference and geographical information. In some embodiments, the GPS circuitry 80 of the sensor devices 34 may be omitted and the GPS circuitry 94 of the receiver device may be configured to provide a timing reference to the sensor devices 34 for use in synchronizing the timing of sampling operations of the sensor devices 34. The timing reference of the GPS circuitry 94 may also be used for timestamping the measurement data received from the sensor devices 34 in one embodiment.

User interface 96 may include a display and a user input to enable a user to configure the sensor devices 34 during setup/installation in one embodiment. In addition, the user interface 96 may convey information regarding the measurement data received from the sensor devices 34 and may display reports and statics calculated by processing circuitry 92 in one implementation.

Referring to FIGS. 6a-6c, one embodiment of an induced arrangement of sensor circuitry 70a including a core 91 and coil winding 93 is shown. The illustrated sensor circuitry 70a is configured to detect an electromagnetic field as a result of AC current flowing in conductor 32 and which induces an electrical current within the coil winding 93 and which may be monitored as an analog signal via output 95. Signals at output 95 may be sampled and digitized in one embodiment.

In one embodiment, the core 91 comprises a magnetic core. Since the sensor circuitry 70a detects the electromagnetic flux generated by the flowing current, the sensor circuitry 70a generates measurement data which is indicative of the current flowing through the conductor 32 without electrical connection of the winding 93 of the sensor circuitry 70a with the electrical conductor 32 in at least one embodiment. Accordingly, the sensor circuitry 70a is electrically insulated from the electrical conductor 32 being monitored in one configuration.

Core 91 may include an opening 97 as shown in the example embodiment FIG. 6c which permits the sensor circuitry 70a to be installed and positioned about the electrical conductor 32 to be monitored without breaking the electrical conductor 32. Core 91 may be considered to have an omega shape in the illustrated embodiment. Other configurations of sensor circuitry 70a are possible. For example, in one other embodiment, a magnetic plug 99 may be inserted into opening 97 and coupled with core 91 using an appropriate attachment system following installation of core 91 about conductor 32 and which provides a closed loop for magnetic flux.

Referring to FIG. 7, one embodiment of the sensor circuitry 70b which is implemented using hall effect circuitry 100 is shown. Other configurations of hall effect circuitry may be utilized in other embodiments. The illustrated embodiment of hall effect circuitry 100 includes hall elements and associated circuitry in a semiconductor package. The hall effect circuitry 100 according to one embodiment includes a ferromagnetic layer which is used as a magnetic flux concentrator which has a high magnetic gain providing relatively high magnetic sensitivity, low offset, low noise, dynamic bandwidth, and low linearity error. The hall effect circuitry 100 may be implemented using part CSA-IV available from GMV Associates in one embodiment. Other arrangements of hall effect circuitry 100 may be used.

The sensor device 34 is configured to position the sensor circuitry 70b in an arrangement where the hall effect circuitry 100 may measure the electromagnetic field 102 generated by the electrical current flowing with an electrical conductor 32 being monitored. In one embodiment, similar to the sensor circuitry 70a described above and because of the native sensing manner of the hall effect circuitry 100, the sensor circuitry 70b may be electrically isolated from the electrical conductor 32 being monitored during generation of measurement data which is indicative of the current flowing through the conductor 32. Accordingly, the sensor circuitry 70b is electrically insulated from the electrical conductor 32 being monitored in one embodiment.

The sensor circuitry 70b senses current by converting the electromagnetic field generated by current flowing through conductor 32 to a voltage which is proportional to that field. In general, an example current to voltage transfer function is described below as:

$$Vout = \frac{C \times I}{d + D} \quad (E1)$$

Where:
    Vout: Voltage output in milliVolts
    I: Current variable (RMS) in Amps
    d: The distance between the surface of the sensor package and the center of the bus-bar
    C: A constant gain for a specific hall effect circuit 100
    D: A built-in distance offset for a hall effect circuit 100
    The current I in the equation (E1) can also be represented as a function of time according to:

$$I = I_p \times \sin(\omega t + \theta) \quad (E2)$$

Where:
    I: The current value
    Ip: The current peak value

ω: Angular frequency (=2πf)
t The time
θ The initial phase offset
Combining equations E1 and E2 yields:

$$Vout = \frac{C}{d+D} \times Ip \times \sin(\omega t + \theta) \quad \text{(E3)}$$

Equation (E3) may be used to determine the current using a sensed voltage output from hall effect circuit 100. For use of inducement circuitry 70a, d is the distance from the center of conductor 32 to the center of the core 91 and D is a cross-sectional area of core 91 and C is the number of windings.

Referring to FIG. 8, example positioning of a package which includes hall effect circuitry 100 with respect to the conductor 32 is shown according to one embodiment.

In the depicted example configuration, a layer of hall effect material 103 which is internal to the packaging is shown in one arrangement. The hall effect circuitry 100 may additionally include a plurality of external leads 104 which are configured to couple the hall effect circuitry with external circuitry (not shown). In one embodiment, the leads 104 of the hall effect circuitry 100 are positioned symmetrically with respect to the conductor 32. For example, the leads 104 on opposite sides of the packaging are spaced substantially an equal distance (r) from the conductor 32 during monitoring operations. It is desired to position the hall effect circuitry 100 with respect to the conductor 32 in a manner which aligns the circuit components with the magnetic flux direction and reduces induced voltage potentials which may otherwise result from positioning of the leads 104 at different distances with respect to the conductor 32 and which may result in exposure of the leads to different strengths of the electromagnetic field of the conductor 32.

The described example of the hall effect circuitry 100 has a sensitivity direction. When the electromagnetic field matches the sensitivity direction, the hall effect circuitry 100 outputs a positive voltage waveform (e.g., first half of a sinusoidal waveform). When the current is reversed, the electromagnetic field is opposite to the sensitivity direction, and the hall effect circuitry 100 outputs a negative voltage waveform (e.g., second half of a sinusoidal waveform).

The hall effect circuitry 100 may be tested and calibrated in a laboratory prior to installation in the field. For example, the hall effect circuitry 100 may be positioned at an initial distance from the conductor 32 and a reference current may be applied to the conductor 32 and the output may be monitored and the distances of the leads 104 from the conductor 32 may be adjusted using the monitored output until an expected output value is achieved indicating correct positioning of the leads 104 with respect to the conductor 32.

In one example, a laboratory calibration of the hall effect circuit 100 detects and records alignment deviation between the conductor 32 to be monitored and the sensor device 34 resulting from the assembly process. For arrangements using multiple hall effect circuits (e.g., dual or triple), it is desired to provide the circuits 100 at proper positions with respect to one another within the sensor device 34 as well as spacing the circuits 100 at appropriate distances from the conductor 32. The calibration may be used to detect and record differences in the outputs of the circuits 100 with respect to one another and to provide appropriate correction factors which may be used in the field to account for the differences.

During installation in the field in one embodiment, it is desired to mount the hall effect circuitry 100 with respect to the conductor 32 in an arrangement which is matched as close to possible to the arrangement in the laboratory where the testing and calibration was performed. Re-calibration may be implemented upon installation in the field since the installation location may have a different geo-magnetic field than the laboratory where the initial calibration was performed and the conductor 32 being monitored may have a non-uniform surface and different sizes.

A set of electronic parameters ascertained during calibration in the factory may be stored within storage circuitry 74 of the sensor device 34 and used to field configure the sensor device 34 during installation in one embodiment. Furthermore, some of the described arrangements of sensor device 34 utilize wireless communications and appropriate parameters (e.g., signal strength, SNR, communications distances with respect to receiver device 36) may be determined for a particular installation. Other configuration data for a given installation may include parameters which specify voltage ranges to be monitored, sampling rates, output ratios cycles per read, alarm levels, security codes, frequency hop, etc.

In one embodiment, sensor device 34 is configured to process the measurement data. For example, the processing circuitry 72 may process the measurement data to determine the current flowing through the conductor. In another example, the processing circuitry 72 may perform digital signal processing of the measurement data to calculate phasors of the electrical power system. In one more specific example, the phasor calculations are performed using a Fourier-based filter which may be applied to a quasi-stationary sinusoidal signal (e.g., 50 or 60 Hz for electrical power systems). The processing filters out the stationary portion of the signal and reveal relative angles of the sinusoids and any dynamic (i.e., non-stationary) components of the signal. The determined current flowing through the conductor is the signal which is processed for the phasor calculations in one example embodiment. Furthermore, a reference sinusoid may be calculated using GPS signals to enable calculation of meaningful phasors. Additional details regarding phasor measurements for power systems and use of GPS signals to generate a reference sinusoid are discussed in "Synchronized Phasor Measurements in Power Systems," by AG Phadke, IEEE Computer Applications in Power, April 1993, pp. 10-15, the teachings of which are incorporated herein by reference. In other embodiments, circuitry of the receiver device 36, control system 38 or other circuitry calculates the phasors.

Referring to FIGS. 9-18, a plurality of different arrangements of a plurality of hall effect circuits 100 within a sensor device are shown and described according to a plurality of example embodiments. Other embodiments are possible, for example using a single hall effect circuit 100 as shown in FIG. 8.

The use of a plurality of hall effect circuits 100 may provide benefits compared with single circuit arrangements, such as improved accuracy, enable error correction, and/or facilitate installation and calibration. Utilization of a plurality of circuits 100 in one embodiment provides an output having increased signal-to-noise ratios compared with single circuit 100 arrangements. Furthermore, arrangements having plural circuits 100 may detect and quantify stray magnetic fields which may be accounted for during sensing of currents within the electrical conductor 32.

Figure 9:
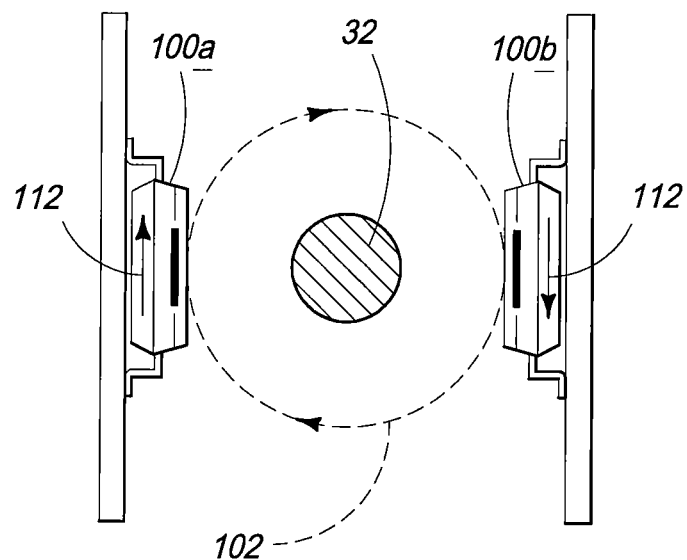
FIG. 9 is an illustrative representation of sensor circuitry including dual hall effect circuits positioned with respect to a conductor being monitored according to one embodiment.

The arrangement of FIG. 9 may be referred to as a symmetric dual chip (SDC) mode embodiment where two hall effect circuits 100a, 100b are positioned at opposite sides of the electrical conductor 32 and at substantially equal distances from the electrical conductor 32 in one implementation. The sensitivity directions 112 of the hall effect circuits 100a,b are aligned with one another in the illustrated example embodiment and the hall effect circuits 100a,b output sine waves with substantially 0 phase shift relative to one another. In one example embodiment of FIG. 9, it is desired to provide the circuits 100 at the same distance with respect to the electrical conductor 32 during calibration and operation. In one installation embodiment upon an electrical conductor 32, the outputs of the two circuits 100a, 100b may be compared to one another and the positioning of the hall effect circuits 100a, 100b may be adjusted relative to the electrical conductor 32 until the amplitudes of the outputs of the circuits 100a, 100b are equal indicating proper positioning of the circuits 100a, 100b with respect to the electrical conductor 32.

During operation, the distances between the conductor 32 and one or more of the circuits 100a, 100b may vary, for example due to sway of the conductor 32. Accordingly, the outputs of the circuits 100a, 100b may differ from one another in some implementations. In the described implementation, the distances between the circuits 100a, 100b may be fixed even if the position relative to the conductor 32 changes and the outputs of the circuits 100a, 100b may be combined (e.g., averaged) to provide output measurement data which is indicative of the current flowing within the conductor 32.

Furthermore, plural circuits 100a,b having their sensitivities arranged in opposing directions with respect to the electromagnetic field generated by current flowing within conductor 32 permits the detection of interfering magnetic fields in one embodiment. In one example, a static magnetic field may flow in a downward direction with respect to the example of FIG. 9 and the circuits 100a,b may be configured to have their respective sensitivities also in a downward direction. This static interference would result in a substantially constant noise ground either raising or lowering the output of the circuits 100a,b according to the sensitivity directions of circuits 100a,b. In one embodiment, no current is conducted within the conductor 32 and the outputs of the circuits 100a,b may be processed to determine if any interference (e.g., stray magnetic fields) are detected. The detected noise may be stored and the output of the circuits 100a,100b may be processed using the detected noise in one implementation (e.g., the stored values indicative of the interference may be subtracted from the outputs of the circuits 100a, b to remove the noise).

In one embodiment where the sensitivities of circuits 100a, b are opposite to the electromagnetic field about conductor 32, the outputted data signals of the circuits 100a,b may be combined (e.g., subtracted from one another) during processing which would result in the noise component of the outputted signals from circuits 100a,b being canceled due to the orientation of the sensitivity directions of the circuits 100a,b being aligned with the stray field, but the sensitivity directions are opposing with respect to the electromagnetic field to be monitored resulting from the flow of current within the conductor 32. The outputted data signals may be subtracted from one another which substantially reduces the noise in the output and doubles the output signal increasing the dynamic range and signal-to-noise ratio in this described embodiment.

Figure 10:
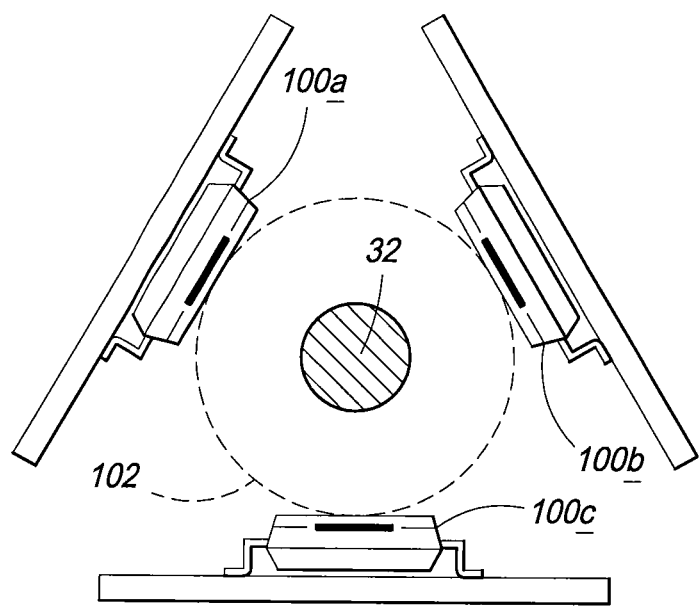
FIG. 10 is an illustrative representation of sensor circuitry including triple hall effect circuits positioned with respect to a conductor being monitored according to one embodiment.

Referring to FIG. 10, a plurality of hall effect circuits 100a-c are symmetrically positioned at approximately 120 degrees from one another about the electrical conductor 32. The circuits 100a-c are positioned at substantially the same distance from the electrical conductor 32 in one embodiment. The example arrangement of FIG. 10 facilitates calibration and installation. Furthermore, an error in one of the hall effect circuits 100a-c may be easily detected using the outputs of the other two circuits 100a-c.

More specifically, in the example, the circuits 100a-c are spaced approximately 120° apart from one another which facilitates locating of the center of the circuits 100a-c by monitoring their outputs as the positions of the circuits 100a-c are adjusted. The installation of the arrangement of FIG. 10 is also facilitated using the data determined during manufacture and calibration. During operation, an output of one of the sensors 100a-c may be disregarded if it differs from a same matching output of the other two circuits 100a-c.

Figure 11:
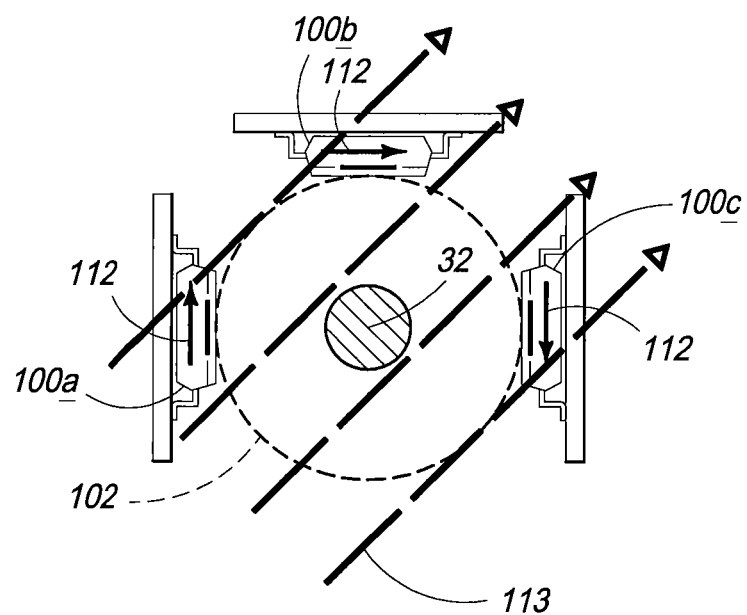
FIGS. 11 and 12 are illustrative representations of sensor circuitry including triple hall effect circuits positioned with respect to a conductor being monitored according to another embodiment.

Referring to FIG. 11, another example arrangement including a plurality of hall effect circuits 100a-c is shown. This illustrated embodiment includes three circuits 100a-c arranged approximately 90 degrees apart from another. The circuits 100a-c are positioned at substantially the same distance from the electrical conductor 32 in one embodiment. This illustrated embodiment is configured to detect and measure interference, for example interference resulting from a stray magnetic field 113, such as the Earth's magnetic field. The sensitivities 112 of the circuits 100a-c are aligned with another in the illustrated embodiment. The illustrated arrangement may be used to detect the stray field 113 after installation of the circuits 100a-c about the electrical conductor 32 and prior to the application of a current to the conductor 32. In the example of FIG. 11, the stray magnetic field 113 encounters the circuits 100a-c at approximately 45 degrees which produces positive outputs in circuits 100a and 100b while circuit 100c provides a negative offset output. These offset voltages may be calculated during calibration and the outputs of the circuits 100a-c may be adjusted to reduce the effects of the offsets upon the output of the circuits 100a-c in one embodiment.

Figure 12:
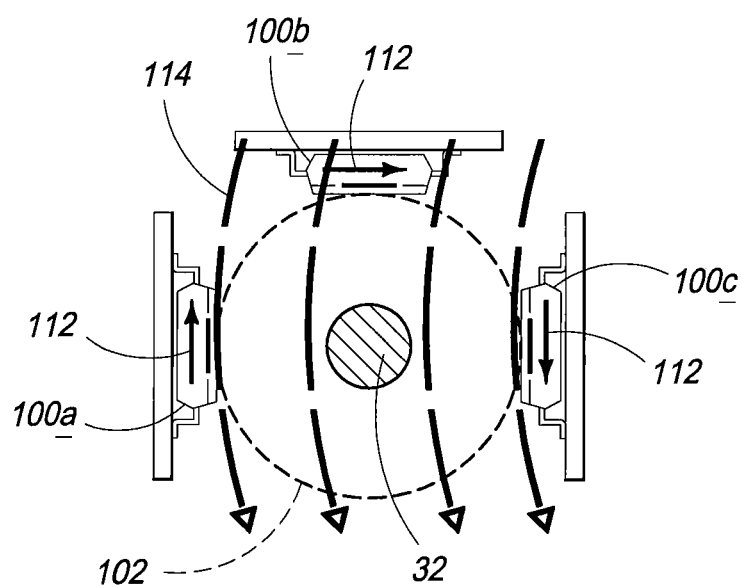

Referring to FIG. 12, the arrangement of FIG. 11 may also be configured to detect dynamic interference, such as a dynamically changing magnetic field (e.g., resulting from a peer conductor, a transformer, or a vehicle passing in proximity to the circuits 100a-100c). In the illustrated example, the example interference 114 is substantially parallel to the sensitivity directions 102 of circuits 100a and 100c and substantially perpendicular to circuit 100b. The outputs of the circuits 100a-c may be measured in the absence of an applied electrical current to conductor 32 (e.g., after installation upon conductor 32 and prior to application of current to conductor 32 or following removal of the current from conductor 32) to detect the presence of interference 114. In the illustrated embodiment, the example interference 114 produces induced voltages of opposite polarity in circuits 100a, c and approximately zero output in circuit 100b. The static or dynamic fields detected during installation and calibration may be utilized to modify the outputs of the circuits 100a-c in one embodiment.

The outputs of the circuits 100a,b of the arrangement of FIG. 9 may be filtered to reduce the effects of dynamic interference in one embodiment. The field resulting from current flowing within the electrical conductor 32 is detected by the circuits 100a,b which provides substantially equal waveforms which are inverted with respect to one another in an example embodiment where the sensitivity directions of circuits 100a, b are in opposite directions with respect to the electromagnetic field generated by current flowing in conductor 32. The presence of stray magnetic fields from other sources may be assumed to be originating from sources located at distances from the circuits 100a,b which are greater than distances with respect to the electrical conductor 32 and accordingly the interference may be presumed to have substantially the same direction with respect to circuits 10a,b when both of the circuits 100a,b detect the interference. The sensitivity directions 102 of the circuits 100a,b are aligned (or both opposed) with respect to the stray magnetic field and accordingly the outputs of the circuits 100*a,b* resulting from interference having a common direction have substantially equal magnitudes but are inverted with respect to one another. The outputs of circuits 100*a,b* are subtracted from one another which substantially reduces the effects of the interference while also doubling the detected output corresponding to the current flow within the conductor 32 compared with arrangements which utilize a single circuit 100.

Referring to FIGS. 13*a*-13*b*, one example asymmetrical arrangement of plural hall effect circuits 100*a,b* is shown according to one embodiment. As shown in FIG. 13*a*, the circuits 100*a,b* are asymmetrically positioned at the same side of the electrical conductor 32 being monitored and at different distances d1, d2 with respect to the electrical conductor 32 being monitored. As shown in FIG. 13*b*, the circuits 100*a,b* may also be offset from one another with respect to an axial direction of the conductor 32 or aligned above a common location of the conductor 32 in another arrangement. Referring to FIG. 14, an output (e.g., Volts) of the circuits 100*a,b* is graphically represented with respect to distance of the circuits 100*a,b* with respect to the conductor being monitored. As illustrated, the output of the circuits 100*a,b* falls with increasing distance of the circuits 100*a,b* from the conductor 32.

In one embodiment, the circuits 100*a,b* may be spaced at a predefined distance from one another during manufacture of the sensor circuitry shown in FIGS. 13*a,b*. The circuits 100*a,b* may be thereafter positioned a predefined distance with respect to the electrical conductor 32 during installation.

Figure 15:
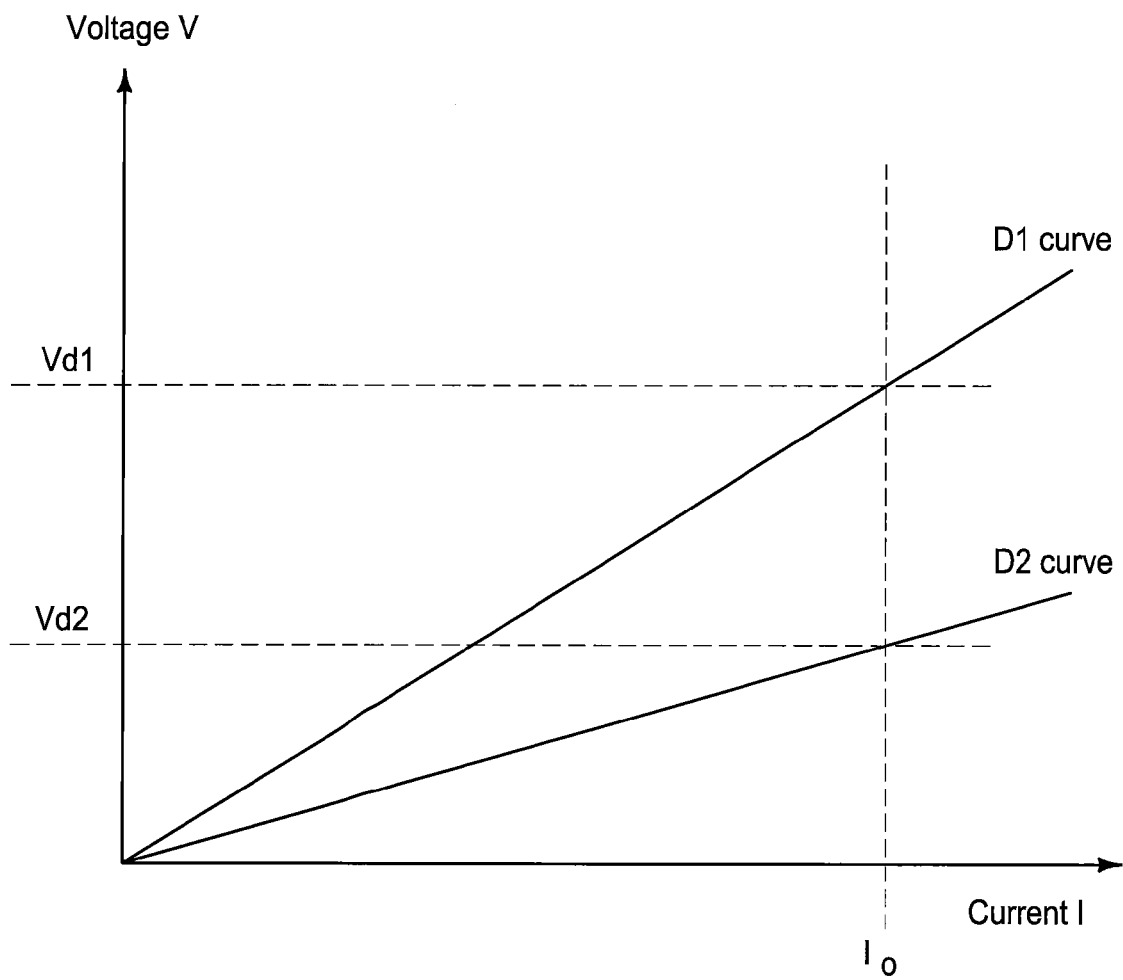
FIG. 15 is a graphical representation of voltage versus current for different distances of a sensor device from the conductor being monitored according to one embodiment.

Referring to FIG. 15, Equation 1 (E1) discussed above may be used to provide two current-to-voltage transfer functions (E4 and E5) for the circuits 100*a,b* which are spaced respective distances d1 and d2 from the conductor 32:

$$V1 = \frac{C}{d_1 + D} \times I \tag{E4}$$

$$V2 = \frac{C}{d_2 + D} \times I \tag{E5}$$

$$\frac{V_1}{V_2} = \frac{d_2 + D}{d_1 + D} \tag{E6}$$

Vout: Voltage output in milliVolts
I: Current variable (RMS) in Amps
d: The distance between the circuit and the center of the conductor
C: A constant gain for a specific chip set
D: A built-in distance offset for a chip set Equations E4 and E5 are two linear equations where voltage and current are linearly related with one another with different slopes as shown in FIG. 15 where D1<D2. For a given current value $I_0$, there are corresponding voltages on the D1, D2 curves for each of the circuits 100*a,b*.

Equation (E6) is provided if it is assumed that C is assumed to have the same value and the ratio of V1 over V2 becomes the ratio of d2+D over d1+D and V1 and V2 are related to the distances d1 and d2 when the distances d1 and d2 are fixed. Outputs of V1 and V2 which violate this relationship indicate the presence of dynamic interference or perhaps a hardware, mechanical or software error. Testing may be performed in an attempt to determine if an error is present or a compensation algorithm may be performed to attempt to model the interference. The single-side arrangements of FIGS. 13*a* and 13*b* may be implemented in conjunction with the different arrangements of FIGS. 9-12 in order to increase accuracy and error correction capability in some embodiments. For example, multiple circuits 100 may be used on one or both of the opposing sides of the conductor of FIG. 9 or on one, two or three of the sides of the triple circuit arrangements of FIGS. 10-11 in further illustrative embodiments.

In one example application, current sensors may be used to provide power protection where the sensors are configured to withstand overload conditions up to 3-4 times normal monitoring ranges. The example configurations described above having sensor circuitry 70 spaced different distances from the conductor 32 provide different sensitivities to the electrical characteristic being monitored and may be utilized to provide current monitoring in power protection applications in one implementation. Some of the described embodiments continue to monitor the conductor 32 and provide information regarding the conducted currents in the presence of overload conditions which may be used to provide alarm messages and control downstream equipment without damaging the sensor circuitry.

Referring to FIG. 16, an example embodiment of the sensor circuitry configured to implement multi-range switching includes three circuits 100*a*-*c* arranged at respective distances d1, d2, d3 from the electrical conductor 32 being monitored. The circuitry 100*a*-*c* have different sensitivities to the electromagnetic field generated by the electrical energy flowing through the conductor 32 in the described embodiment. Other numbers of circuits 100 may be used in other embodiments to provide additional sensitivities.

The outputs of the respective circuits 100*a*-*c* may be utilized at different moments in time depending upon the magnitude of the currents being conducted within the conductor 32. During normal operational current ranges, the output of the circuit 100*a* which is closest to the conductor 32 may be used to monitor the current. Circuit 100*a* may be positioned at a distance where it will not be saturated by the electromagnetic field generated by current flowing within normal operational conditions. However, the output of circuit 100*a* may be saturated in the presence of overload conditions upon conductor 32 whereupon circuit 100*b* may be used to monitor the current within conductor 32. Furthermore, the circuit 100*c* may be used to monitor the current within conductor 32 if the overload conditions saturate circuit 100*b*. Monitoring via circuit 100*a* may be resumed when the overload conditions cease and the conducted currents return to normal operational ranges. A plurality of different arrangements of the asymmetrical circuits 100 may be configured to monitor different ranges of currents at a plurality of different sensitivities depending upon the application. In one embodiment, the circuits 100*a*-*c* continually monitor the conductor 32 while the processing circuitry 72 may activate individual ones of the circuits 100*a*-*c* depending upon the strength of the electromagnetic field in another embodiment.

Referring to FIG. 17, a graphical representation of output versus distance of the hall effect circuit to the conductor being monitored is shown. A distance relationship with current was derived using equation E1 above as:

$$d = \frac{C}{V} \times I - D \tag{E7}$$

where V is the saturation range for a specific hall effect circuit. The offset for the hall effect circuit (D) is typically small (e.g., 0.5) and may be ignored which provides:

$$d = k \times I \tag{E8}$$

where k is a constant slope value (k=c/v) for a plurality of circuits 100*a-c* of the sensor circuitry. The distance is linear to the current and the example sensor circuitry may monitor overload conditions up to three times the normal load if d2=2d1 and d3=3d1 in one possible embodiment.

The described sensor circuitry may also be configured to provide information regarding direction of current flow in one embodiment. Referring again to FIG. 13B, a plurality of circuits 100*a,b* may be positioned adjacent to different axial locations of the electrical conductor 32 being monitored in some embodiments. The circuits 100*a,b* are spaced by known or defined distances from one another in one embodiment. In addition, the circuits 100*a,b* may be positioned different distances from the electrical conductor 32 in one embodiment shown in FIG. 13B or at the same distance as shown in FIG. 18.

Figure 19:
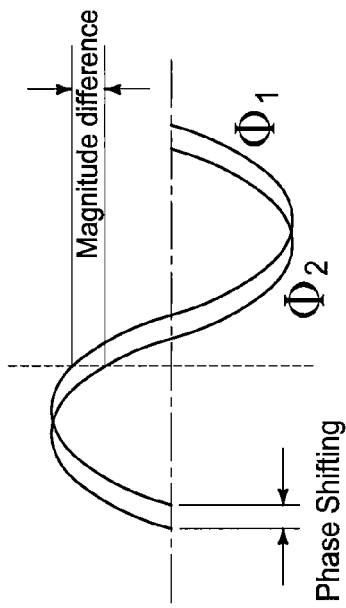
FIG. 19 is a graphical representation of phase shifting and a magnitude difference of a measured signal according to one embodiment.
Figure 18:
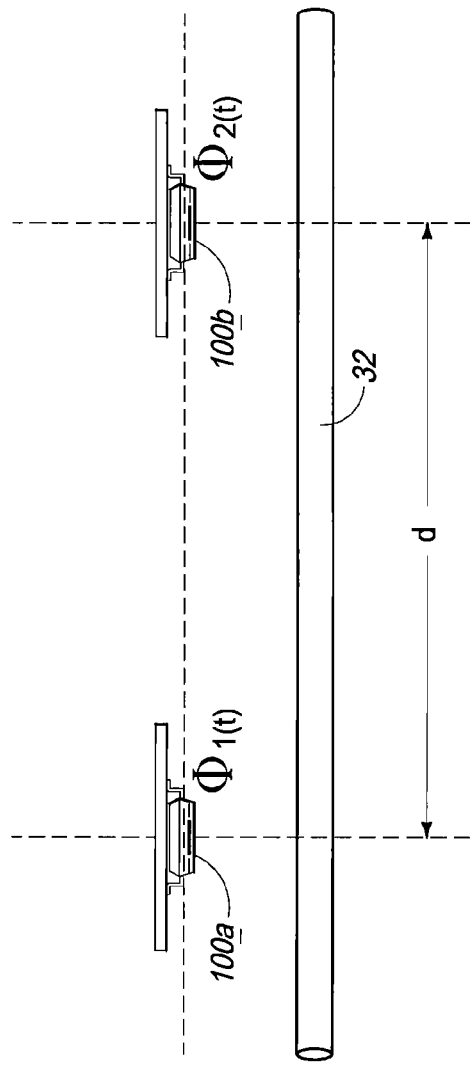
FIG. 18 is an illustrative representation of plural sensor devices positioned adjacent to different portions of a conductor being monitored according to one embodiment.

The discussion proceeds with respect to the embodiment of FIG. 18 where the circuits 100*a,b* are spaced substantially the same distance from the conductor 32. The output of the circuits 100*a,b* may be sampled at the same moment in time in one implementation. Referring to FIG. 19, the magnitude difference between the two samples may be used to calculate the phase shifting of the two signals to assist with determination of flow direction.

Electric current travels extremely fast (e.g., nearly 300×10$^6$ m/s) and the distance d between the circuits 100*a,b* is relatively small. In one embodiment, it is desired to avoid the placement of any capacitive or inductive sources or equipment between the locations of the circuits 100*a,b* which may cause phase shifting of the signals. Furthermore, the timing of the sampling at the plural circuits 100*a,b* is within microseconds or nanoseconds with one another to provide accurate measurements in one embodiment. GPS may be used to synchronize the sampling of the circuits 100*a*,100*b* in one embodiment. The differences of the magnitude and phase shift may be relatively small for every comparison of two samplings. In one embodiment, the differences may be added over time (e.g., >100 k samples) to determine the direction of the current flow.

In one embodiment, two sensor devices 34 are positioned a fixed distance apart from one another as far as reasonable (e.g., 3K meters) with no (or constant) capacitive and inductive loads between the devices 34. The flow of current takes approximately 10 microseconds from one measuring point to another in this example and the current is measured at both devices 34 at the same moment in time. The flow direction is from the first device 34 to the second device 34 if the measurement at the second device lags the measurement at the first. Other embodiments are possible.

For example, electric current used in electric power systems may be either alternating (ac) or direct (dc). In ac systems the direction of current flow along a given path, such as a single transmission line conductor, reverses many times per second. In most of North America, for example, the direction of current flow for ac systems reverses itself 120 times per second forming 60 complete cycles of two-directional current flow. Instantaneous power flow in ac systems is defined as the product of the current flowing between two points and the voltage between those two points with all measurements taken at precisely the same instant in time. Average power flow in ac systems is defined as the integral of instantaneous power flow over one full cycle of the ac waveform. The direction of average power flow, i.e. whether the sign of the average power is positive or negative, is an important parameter used in power system operations and control. The phase of the average power flow, also known as the power factor angle, is the difference between the phase of the current waveform and the phase of the voltage waveform during the period of the integral. The phase of the average power flow is also an important operational parameter. In one embodiment it is desired to measure voltage between two points on a conductor exposed to the circuits 100*a,b* and to use the voltage and current measurements over a period of time to calculate the direction of average power flow and the power factor angle. Within one foot of length of a current-carrying conductor, for example, there may be tens of millivolts of difference in electrical potential. This small voltage can be measured using conventional methods. In one embodiment, the millivolt signal is first amplified using an operational amplifier. The amplified signal is then directed to a 16-bit analog-to-digital converter (ADC). Once digitized by the ADC, the millivolt signal is digitally scaled and fed into a computer algorithm designed to calculate the average power using a digital integration method.

Figure 20:
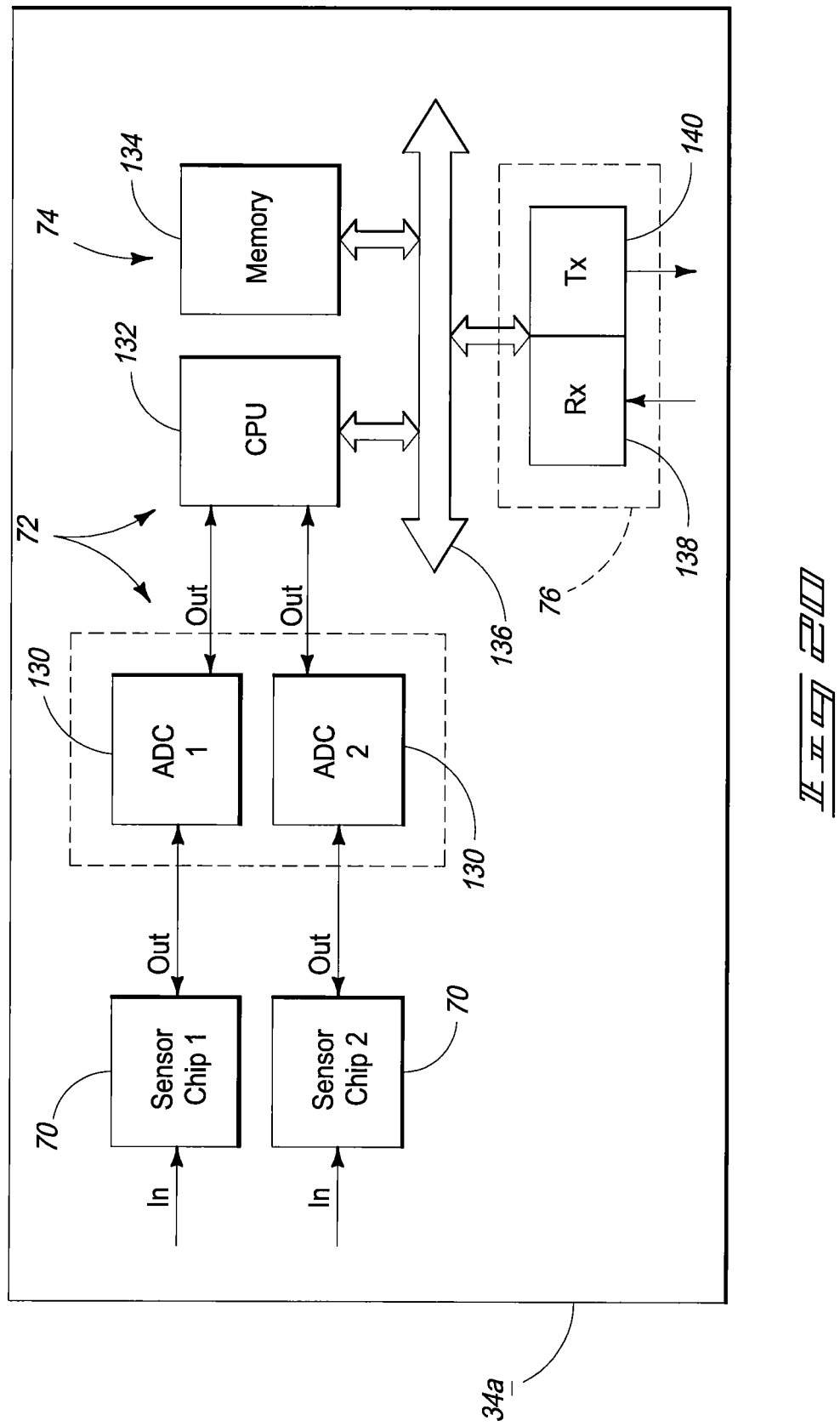
FIG. 20 is a functional block diagram of a sensor device according to one embodiment.

Referring to FIG. 20, one configuration of a sensor device 34*a* is shown according to one embodiment. The illustrated embodiment of the sensor device 34*a* includes a plurality of sensor circuits 70 which are coupled with processing circuitry 72 including analog-to-digital converters (ADC) 130 and a CPU 132. The CPU 132 controls sampling of the output of the sensor circuits 70 at appropriate moments in time to provide the measurement data indicative of the current and stores the measurement data using storage circuitry 74 comprising appropriate memory 134 coupled with a bus 136 in one configuration. In one embodiment, the samplings of the analog signals are synchronized in time. The CPU 132 may also control the communication of the measurement data externally of the sensor device 34 using communications circuitry 76 in the form of a wireless transceiver including a receiver 138 and transmitter 140 individually configured to communicate electromagnetic signals (e.g., radio frequency signals).

In one embodiment, the ADCs 130 provide 14 bits of sampling resolution which covers an example current range of 0 to 5,000 Amperes with a total of +/−8,192 resolutions with 1 Ampere incremental values. For SCADA applications, ADCs 130 which provide 16 bit samples at 128 samples/cycle may be used. ADCs 130 providing 8 ksps (e.g., 160 samples per cycle for 50 Hz AC and 133 samples per cycle for 60 Hz AC) and having a conversion time of less than 10 us may be used in one embodiment. The ADCs 130 may output data in serial or parallel depending upon the application requirements of the design.

In one embodiment, the transmitter 140 receives the stored samples of measurement data from memory 134 and encodes them into a transmittable data stream which is modulated onto a radio waveform for communication to receiver device 36. Electrical energy is typically distributed and transmitted at 50 or 60 Hz AC in an example power distribution or transmission implementation. A cycle is approximately 20 ms for a complete sine wave of 50 Hz energy. In one configuration, sensor device 34 transmits a single digitized sine wave every cycle (e.g., within 20 ms). Accordingly, in one embodiment, the transmitter 140 encodes the measurement data into a frame of a transmittable data stream, modulates the frame onto a radio waveform, handshakes with the receiver device 36 (channel access) and transmits the wireless radio signal to the receiver device 36.

Figure 21:
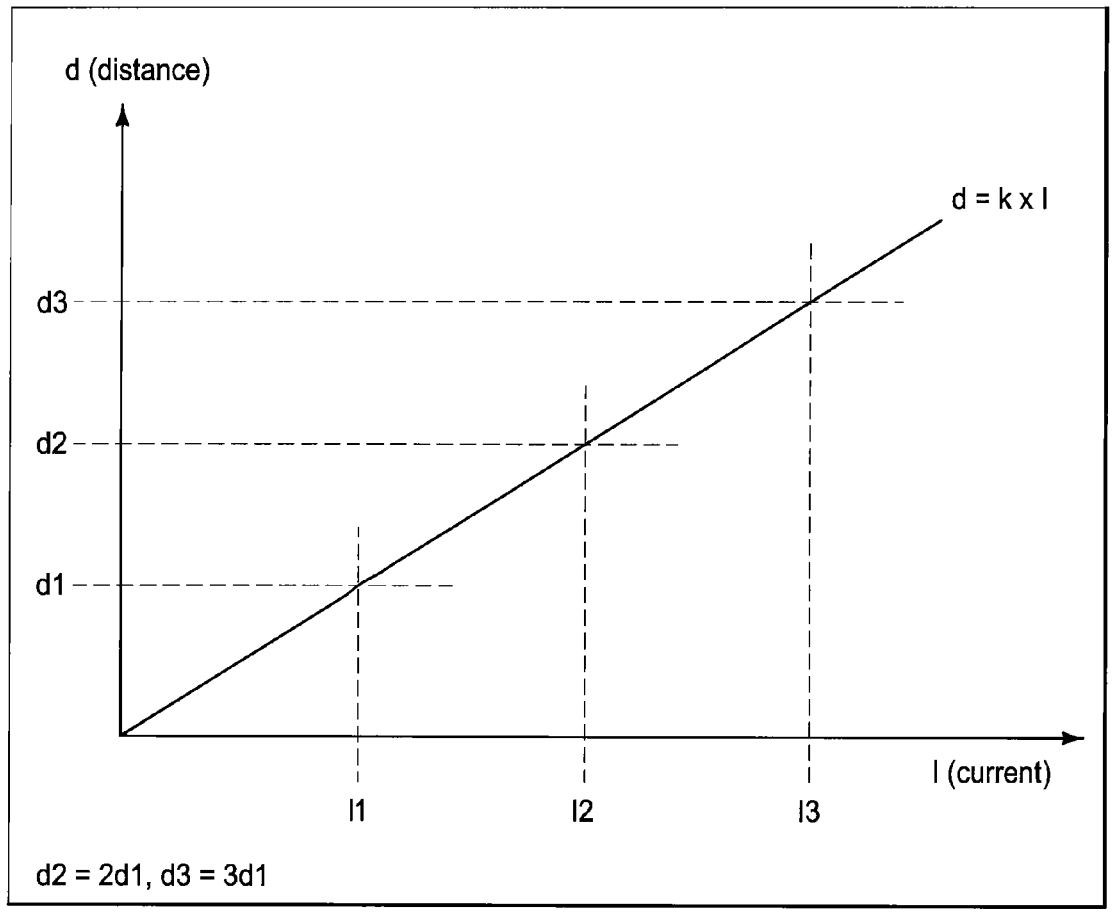
FIG. 21 is an illustrative representation of generation of a frame using a sensor device according to one embodiment.

Referring to FIG. 21, the transmitter 140 receives the digitized samples of the measurement data 150 and creates a data frame 152 which includes a media control portion 154 and digitized measurement data portion 156. The data frame 152 is encoded, modulated and transmitted as a radio signal 159. The media control portion 154 represents the data encoding, modulation and channel access method used for the appropriate wireless communications protocol used to transmit the data.

For secured communications embodiments, information protection may be applied to layer 1 (PHY) and layer 2 (MAC) against malicious attacks. The data may be encrypted using software or hardware implementations and public and private keys (e.g., COMSEC or TRANSEC) to further improve security.

Different wireless communications protocols may be used to communicate the measurement data between the sensor devices 34 and receiver device 36 corresponding to the design considerations including performance (e.g., data rate and time delay), capacity (e.g., the number of sensor devices 34 accommodated for a given receiver device 36), cost, etc. Various protocols which may be used and include Cellular technology (e.g., TDMA, CDMA, FDMA), mobile ad hoc technology (e.g., WiFi, WiMax, OFDM, DIMA, MINO, Bluetooth), and military waveforms (e.g., Link16, JTRS, WNW, TCDL, FCS, TTNT, AMF, and DIMA).

Example radio signal transmission modes include an Omni broadcast mode and a point-to-point mode. The Omni broadcast mode enables CSMA (Carrier Sense Multiple Access), MIMO (Multi-Input Multi-Output) and MUD (Multi-User Detection) technology while the point-to-point mode provides an increased level of security (less susceptible to interference and increased protection against malicious and jamming attacks). A directional antenna may be utilized in the Omni broadcast to reduce interference and increase bandwidth efficiency. WiFi (802.11a, g) may be used in one embodiment at 5 GHz which provides a maximum data rate of 54 mbps at the PHY layer or an average of 19-23 mbps at the application layer.

As mentioned above, one embodiment of the sensor device 34 is electrically insulated from the electrical conductor 32 being monitored. In addition, some arrangements of the sensor device 34 are further electrically insulated from other electrical conductors. In one specific embodiment, the sensor device 34 derives electrical energy from a power source which is electrically insulated from conductors which are external of the sensor device 34. Furthermore, the communications circuitry 76 may utilize wireless communications in one embodiment and accordingly the sensor device 34 is not electrically connected with any external circuitry for communications purposes. Accordingly, one embodiment of the sensor device 34 is substantially electrically insulated from all external electrical conductors. In other embodiments, the sensor device 34 may be electrically connected with external conductors for one or more of current monitoring, transmission, operational power, etc.

As mentioned above, different configurations of the sensor device 34 may utilize different power generation systems (e.g., battery, photovoltaic circuitry, induction circuitry or wireless energy) depending upon the particular implementation. Different rechargeable batteries may be used depending upon power requirements and the sensor device 34 may be operated in power reduction modes to reduce energy consumption.

Referring to FIG. 22, one example embodiment of power circuitry 78a configured to generate operational electrical energy from the current flowing through the conductor 32 is shown where the current being monitored is alternating. The power circuitry 78a includes a winding 160 about a core 162 which are positioned about the electrical conductor 32. The core 162 and winding 160 form an opening 164 in one embodiment which permits the sensor device 32 to be positioned about the conductor 32 without a need to break the conductor 32 being monitored which facilitates installation of the sensor device 32. The changing electrical energy flowing through the conductor 32 creates an electromagnetic field which induces electrical energy within the winding 160. The induced electrical energy is converted from alternating electrical energy to operational direct current energy using an AC-to-DC converter 166 and which charges a rechargeable battery 168 and powers circuitry 169 of the sensor device 34 (e.g., sensor circuitry 70, processing circuitry 72, storage circuitry 74, communications circuitry 76, GPS circuitry 80 and other circuitry in one embodiment). Furthermore, rechargeable battery 168 may provide operational energy at moments in time when current is not flowing through conductor 32. In addition, the sensor device 34 may be controlled (e.g., from a command from receiver device 36) to operate in a reduced power mode to conserve energy at moments in time when current is not flowing through conductor 32.

In some arrangements, internal photovoltaic devices or wireless power transmission (e.g., radio frequency, microwave, lasers) may be used to deliver operational electrical energy to the sensor devices 34 without external electrical conductors being coupled with the sensor device 34.

In one embodiment, receiver device 36 receives measurement data from a plurality of sensor devices 34. The receiver device 36 may organize the measurement data received from the sensor devices 36 with respective moments in time (e.g., the measurement data for the plurality of sensor devices 34 may be combined together for a given moment in time). The receiver device 36 may forward the combined data to local and/or remote application equipment for monitoring of the currents within the electrical conductor 32 and taking other appropriate actions (e.g., determining amount of current for cost considerations, power protection, or other desired purposes). The receiver device 36 may be sealed and isolated from external environment and accordingly utilized indoors or outdoors.

As discussed above, the receiver device 36 includes appropriate communications circuitry 90 for implementing communications with a plurality of sensor devices 34 in one embodiment. Different wireless communications protocols may be used in different embodiments, for example, including time synchronization and media access protocols. In one embodiment, the receiver device 36 may synchronize the communications of the sensor devices 34.

In one time synchronization protocol, the receiver device 36 is synchronized with the sensor devices 34 prior to communication of data. In one synchronization example, a master and slave mode may be implemented without use of GPS. In this example, the receiver device 36 operates as the time/clock master and the time reference of the receiver device 36 does not change. The sensor devices 34 may individually communicate a time sync request message to the receiver device 36 and include the local time of its internal clock. The receiver device 36 uses the local time of the sensor device 34 and its internal master clock to calculate an offset corresponding to the difference of the clock of the respective sensor device 34 with respect to the master clock. The receiver device 36 communicates the offset to the respective sensor device 34 which uses the offset to adjust its internal clock to correspond to the master clock. In one embodiment, a propagating time delay may be calculated using a known distance between the devices 34, 36 and used in combination with the offset to align the clock of the sensor device 34 with the master clock of the receiver device 36. The clocks may be aligned within a single millisecond or microsecond digit after a coarse sync and fine sync process in one embodiment.

In another embodiment, GPS circuitry may be utilized. For example, the receiver device 36 may include GPS circuitry 94 (without GPS circuitry 80 in the sensor devices 34 in one embodiment). The sensor devices 34 may be synced with global time using the GPS circuitry 94 and the master/slave operational embodiment discussed above in one possible implementation.

In another embodiment, the sensor devices 34 and receiver device 36 include respective GPS circuitry 80, 94 and the devices 34, 36 are synced to the global time.

The receiver device 36 may also operate as a master and the sensor devices 34 operate as slaves to synchronize communications of the plural sensor devices 34 with respect to the receiver device 36 in one embodiment. The receiver device 36 polls the sensor devices 34 individually and the sensor devices 34 do not transmit their respective measurement data until they are polled by the receiver device 36. This example method avoids collisions between multiple sensor devices 34 transmitting simultaneously.

In one embodiment, the sensor devices 34 and receiver device 36 form a many-to-one network without a mesh network or point-to-point connection. In this example embodiment, communications occur directly between individual sensor devices 34 and the receiver device 36 without communications between the sensor devices 34. A plurality of media access methods may be utilized including Multi-User Detection (MUD), static assignment or a polling mechanism which are described below according to some example configurations of the disclosure.

MUD allows multiple sensor devices 34 to transmit messages simultaneously to a single receiver device 36. The receiver device 36 filters the received messages according to the identifications of the sensor devices 34. The sensor devices 34 may utilize coded messages or frequency hopping to concurrently communicate messages in example embodiments. In one specific coded message example, a sensor device 34 includes a training sequence as part of the communicated data and which may includes a time offset and frequency offset. The receiver device 36 uses the signatures to distinguish messages from mixed radio signals from multiple sensor devices 34. With frequency hopping, the sender device 34 changes frequency (e.g., every few milliseconds) during transmission of a single message. Different sending devices 34 use different patterns of frequencies to avoid conflicts on the same frequency band by multiple users.

In a static assignment embodiment, individual sensor devices 34 may be statically assigned respective timesharing slots to communicate with receiver device 36. In one embodiment, a time frame structure is used which includes a plurality of channels or slots for the respective sensor devices 34 to implement their respective communications and avoid collisions. The sensor devices 34 may include identification information during the communications in their respective slots which may be used by the receiver to identify the measurement data from the respective sensor devices 34.

A polling access method is an efficient method to avoid collisions and lower the amount of time used for synchronization of communications. In one polling access embodiment, the receiver device 36 polls the individual sensor devices 36 for communications one at a time. A polling message from the receiver device 36 includes an identifier of a sensor device 34 which is to transmit its measurement data in a following slot. Sensor devices 34 do not transmit messages until they have received respective polling messages from the receiver device 36 which include identifiers of respective ones of the sensor devices 34. One illustration of an example of a polling access method is shown in FIG. 23 where the receiver device 36 transmits respective polling messages sequentially to sensor devices 1-*n* which individually reply with their respective measurement data following receipt of the polling messages. The response messages from the sensor devices 34 may include information regarding the measurement data contained with the responses, such as number of samples and timestamps of when the samples were obtained, and the length and accuracy of the samples in one example. Security of the communications may be enhanced using frequency hopping and coded data measurements in some embodiments.

Referring to FIG. 24, example combining operations of the receiver device 36 are described according to one embodiment. As discussed above, a plurality of sensor devices 34 formulate and communicate a plurality of frames 180 (which individually include control information and measurement data regarding electrical energy flowing within the conductor 32 in the described example) to receiver device 36. Receiver device 36 accesses the frames 180 and decodes the measurement data therein and combines the measurement data from a plurality of sensor devices 34 to form a superframe 182 in one embodiment. The formulated superframe 182 may include a timestamp which corresponds to a common moment in time when the measurement data contained within the superframe 182 was obtained by the sensor devices 34. The superframe 182 may also include information regarding the geographical locations of the sensor devices 34 along the conductor 32 which created the measurement data. The superframe 182 may be communicated locally and/or remotely (e.g., to control system 38 and/or other destinations) for analysis and monitoring of the electrical system.

In some applications (e.g., monitoring the electrical grid), real-time detection, analysis and reaction is implemented in order to minimize the chances that the electrical system being monitored will experience a black-out or other failure. It is desired in these applications to quickly detect the presence of violation conditions (e.g., power failure, power disturbance or other abnormal behavior) and take appropriate action. For example, it may be desired to detect the presence of the violation conditions within 1-3 frequency cycles which is between 16.6-60 milliseconds for 50 Hz or 60 Hz applications.

Referring to FIG. 25, latency of acquisition, communications, processing and delivery of the measurement data are discussed in one embodiment. Acquisition time includes sensing and sampling of the analog signal. If a SCADA standard of 128 samples per cycle is used, the sampling interval is approximately 156.25 microseconds for a 50 Hz signal and the sampling conversion time is approximately 10 microseconds if an 8 KSPS ADC is utilized to provide analog to digital conversion operations. Depending upon the application and configuration of the system, single samples or a series of samples may be obtained. Transmission time depends upon the radio waveform data link rate and is typically less than the acquisition time. For example, the transmission time is approximately 0.8 microseconds for communication of 16 bit measurement data using 20 mbps WiFi in one example. Transmission time increases proportionally if multiple sampling are grouped together and transmitted in one frame. Processing time includes receiving, decoding and combining operations in the described example and is dependent upon the hardware platform and software being used. Delivery time from the receiver device 36 to the control system 38 corresponds to communications from the receiver device 36 to the end user equipment of the control system 38 in the described embodiment. The delivery time may be less than the time utilized for the other operations and can be essentially ignored, for example, if Ethernet is utilized which provides communications of 1,000 mbps.

In some embodiments, one design consideration is the number of samplings in the measurement data included in the frames communicated from the sensor devices 34 to the receiver device 36. Design considerations attempt to achieve a balance between latency (less number of samplings has smaller latency) and overhead (increased number of samplings has less associated overhead). For polling arrangements discussed above in one example, a polling message is outputted by the receiver device 36 for each of the sensor devices 36. In one configuration, the polling messages poll individual sensor devices 34 for a quarter of the samplings of one cycle of the waveform (e.g., 32 samplings of a SCADA standard of 128 samples per cycle).

Processing time may be estimated to be approximately the same as the amount of time to perform the data acquisition in one embodiment and acquisition, transmission and processing is approximately 70 microseconds in the described example. In this example, approximately seventy sensor devices 34 may communicate with a single receiver device 36.

Other design concerns include data integrity and security and the system may be configured to reduce or minimize interference in communications due to noise, jamming, eavesdropping, information leaking and spoofing.

Figure 26:
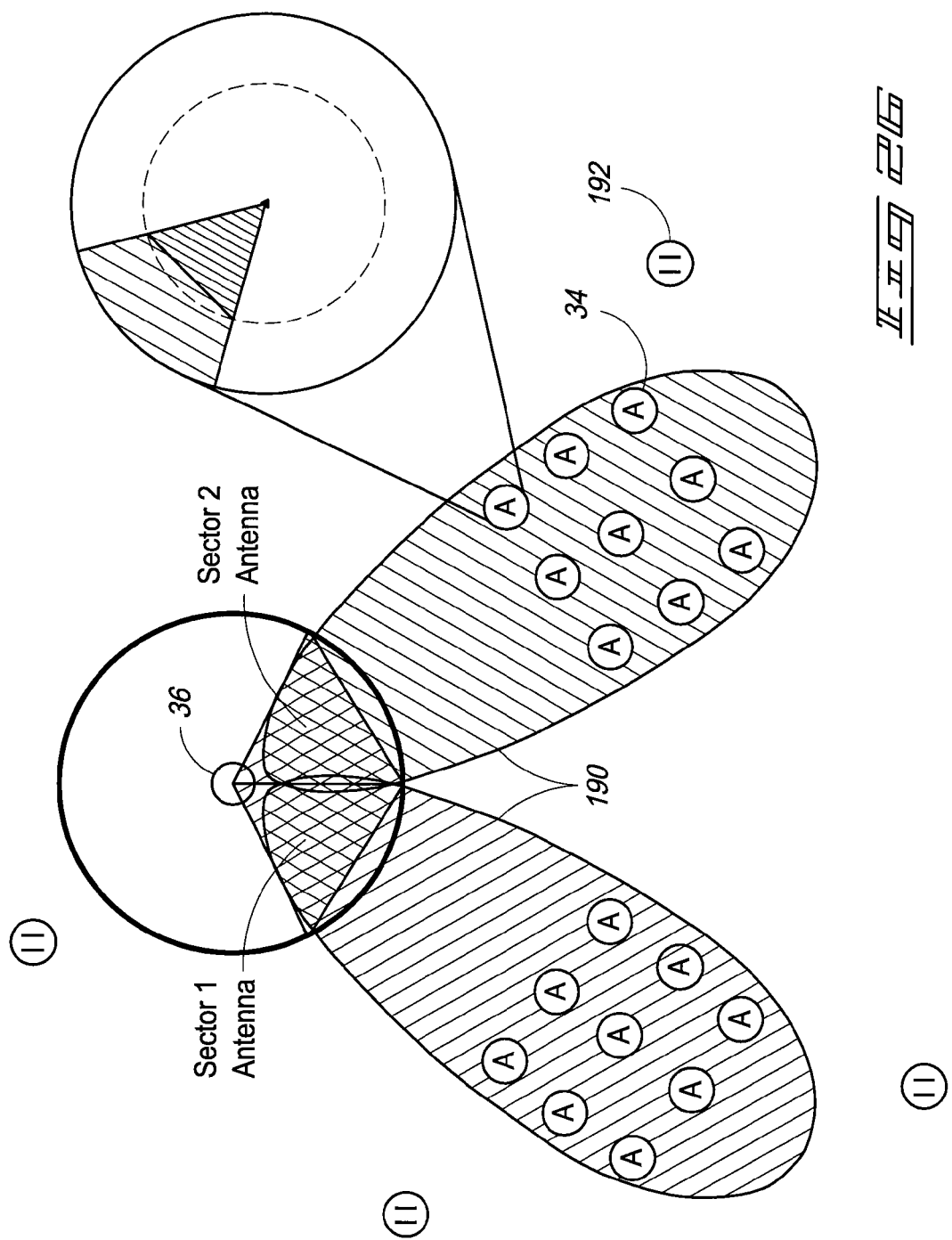
FIG. 26 is an illustrative representation of directional antennae utilized for wireless communications according to one embodiment.

Referring to FIG. 26, one example embodiment utilizing directional antennae is described. The directional antennae provide plural coverage patterns 190 which are designed to receive communications from a plurality of authorized sensor devices 34. The coverage sectors of the antennae are designed to exclude unauthorized sensor devices 192 in one embodiment. Furthermore, the use of directional antennae may provide reduced interference, and reduced chances of jamming and unauthorized access and increased bandwidth efficiency. In addition, layer 2 security may be applied to provide protection from spoofing and eavesdropping from unauthorized users and layer 1 coding and frequency hopping may be used to further provide protection against unauthorized users. Individual sensor devices 34 may also utilize directional antennae which are configured to implement communications with the antennae of the receiver device 36.

Figure 27:
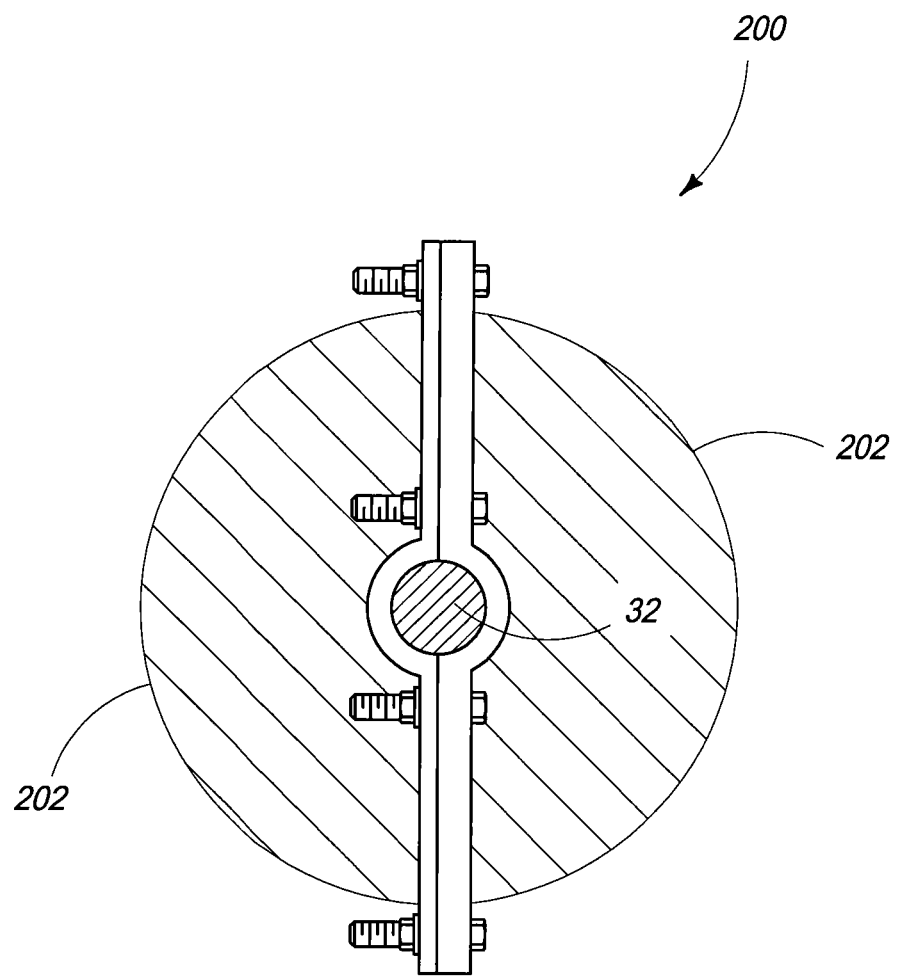
FIG. 27 is an illustrative representation of a housing of a sensor device according to one embodiment.

Referring to FIG. 27, an example of housing 200 for a sensor device 34 is shown according to one embodiment. The example housing 200 includes a plurality of halves 202 of a clam shell which are configured to clamp or otherwise mount the sensor device 34 to the electrical conductor 32 being monitored. In one embodiment, the housing 200 mounts the sensor device 34 to a fixed axial location of the conductor 34 and electrically isolates the circuitry of the sensor device 34 from the electrical conductor 32 being monitored.

The housing 200 may be provided in different sizes corresponding to the application (e.g., 9"-20" in diameter) and be fabricated of a suitable material (e.g., Rovel ABS plastic). The housing 200 shields the internal components and circuitry from the weather. In addition, the example configuration of housing 200 operates as an attachment assembly which is configured to position one or more sensor circuits of the sensor device 34 in an arrangement which permits the sensor circuits to monitor an electrical characteristic of the electrical energy (e.g., using appropriate structure not shown which is internal of the housing 200 and arranged to position the circuitry in different relationships with respect to the conductor 32 as described above in example embodiments). The housing 200 is arranged to physically couple the sensor device 34 to the electrical conductor 32 in the depicted embodiment.

Example embodiments of the sensor device 34 have weights of approximately 7-10 lbs depending upon type of power supply used and capacity. The housing may be painted in accordance with FAA recommendations for maximum visibility. No additional supporting structure or hardware external from the housing 200 is used to position the sensor circuitry of the sensor device 34 with respect to the conductor 32 in the described example embodiment. In one more specific example, the sensor devices 34 are sufficiently light such that the weights of the sensor devices 34 may be entirely supported by the conductor 32 without any other support to ground or other supporting structure.

In some arrangements, a relatively large number of conductors 32 and/or a relatively large number of locations of a given conductor 32 may be monitored in a WAMS implementation. Accordingly, a given system may include a plurality of sub-stations which may individually include one or more receiver devices 36 to communicate with the sensor devices 34. Referring to FIG. 28, one example embodiment of a control system 210 of a substation is shown coupled with an appropriate communications infrastructure 212 with a plurality of receiver devices 36. Furthermore, the control system 210 of the substation may be coupled with a regional control system, for example, via the internet. In one embodiment, control system 210 may access management information (e.g., measurement data) from one or more receiver devices 36 and may provide the information to the region control system or other entity.

Some of the disclosed embodiments enable real-time monitored information regarding the electrical system to be easily shared between multiple systems and may be used for different purposes by different end user equipment. Furthermore, the communications from a receiver device 36 may be in a one-to-many arrangement where the collected measurement data is communicated to multiple recipient devices. In some examples, the measurement data may be used to trip protection relays, issue alarms, control balancing operations of the grid, calculate phasors, are be used for other suitable purposes.

Some of the embodiments described herein provide monitoring systems which may be installed to interface with end user equipment for the power protection industry (e.g., power meters, digital fault recorders, or phase measurement units). In other embodiments, the described embodiments may be embodied within the end user equipments.

At least some aspects of the disclosure provide improvements compared to some conventional sensors, such as some conventional current transformer configurations. For example, some of the disclosed sensors are electrically insulated from the electrical conductor in which the current is being monitored while typical conventional current transformers are wired into the power circuit line, and accordingly, the conductor is opened and power is removed during installation of some conventional current transformers which may take an extended period of time compared with installation of some of the embodiments of the disclosure which are electrically insulated from the electrical conductor being monitored and the electrical conductor need not be broken to install some of the sensor device configurations described herein. In addition, power to the electrical conductor may also be shut down during replacement of some faulty conventional device and preventative maintenance upon such devices which results in further inconvenience to consumers. Also, installation errors or device faults of making an open circuit on the secondary of some conventional current transformer devices may bring down the power circuit and which is reduced or avoided using the sensor devices described herein according to some embodiments where the sensor devices are electrically insulated from the conductor.

According to one embodiment, the described sensor devices 34 are direct replacements for some conventional current transformers. For example, the analog output terminals may be disconnected and a sensor device 34 may be coupled with the conductor as a replacement for the conventional device in one example. In addition, the digitized measurement data provided by sensor device 34 may be converted to analog information if the prior conventional device was utilized with analog and user equipment.

Furthermore, relatively significant insulation protection is typically used in some conventional sensors which are provided in electrical connection with the electrical conductor of high voltage implementations. These conventional devices may be relatively large in size and have increased weight due to this insulation. The size of some relatively large conventional sensors may be a limitation on substation capacity in some arrangements. Some of the described sensor devices may be easily installed at numerous locations of a power system where conventional devices may not be practical and which reduces "blind spots" on the grid.

Some of the disclosed embodiments utilize wireless communications between sensors coupled with various locations of the electrical conductor and a remote monitoring station. These example embodiments provide communications without significant wired connections used in some conventional wired implementations. The sensors of some embodiments of the disclosure are relatively small in size and relatively light in weight, and accordingly, may be installed at locations of the electrical conductors which may not be suitable for conventional current transformer sensors. Some of the disclosed sensor arrangements may be more widely deployed in the electrical grid compared with conventional current transformer designs.

Although some embodiments are discussed with respect to electrical power distribution and transmission, these disclosed embodiments are example possible implementations of the methods, sensors and systems of the present disclosure and the disclosed aspects may be utilized to monitor electrical conductors utilized in other environments apart from electrical power distribution and transmission in other embodiments.

Furthermore, some of the described arrangements disclose sensor devices which are straightforward replacements for conventional transformer sensing systems and provide measurement data which may be integrated and used by existing end user equipment or within entirely new monitoring and control designs.

The protection sought is not to be limited to the disclosed embodiments, which are given by way of example only, but instead is to be limited only by the scope of the appended claims.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

The invention claimed is:

1. An electrical power system sensor device comprising:
   sensor circuitry configured to monitor a characteristic of electrical energy which is conducted using an electrical conductor of an electrical power system;
   an attachment assembly configured to physically couple the sensor device with the electrical conductor and to position the sensor circuitry with respect to the electrical conductor wherein the sensor circuitry monitors the characteristic of the electrical energy which is conducted within the electrical conductor of the electrical power system; and
   wherein the sensor circuitry is electrically isolated from the electrical conductor of the electrical power system.

2. The device of claim 1 wherein the sensor circuitry is configured to detect an electromagnetic field about the electrical conductor to monitor the characteristic comprising current of the electrical energy.

3. The device of claim 2 wherein the sensor circuitry comprises a hall effect circuit which monitors the characteristic of the electric energy comprising high voltage electrical energy equal to or greater than approximately 600 Volts.

4. The device of claim 3 wherein the hall effect circuit is embodied within a package, and wherein a plurality of leads which extend from the package are spaced at a common distance from the electrical conductor.

5. The device of claim 2 wherein the sensor circuitry comprises a winding which is wrapped about a core which is positioned around at least a portion of the electrical conductor.

6. The device of claim 1 further comprising power circuitry configured to generate operational electrical energy which is used by the sensor circuitry to monitor the characteristic of the electrical energy, and wherein the power circuitry is electrically isolated from all electrical conductors which are external of the sensor device.

7. The device of claim 1 wherein the sensor circuitry is configured to generate data signals which are indicative of the characteristic of the electrical energy, and further comprising communications circuitry configured to wirelessly communicate measurement data of the data signals externally of the sensor device.

8. The device of claim 1 wherein the sensor circuitry is configured to monitor an electromagnetic field generated about the electrical conductor as a result of the conduction of the electrical energy using the electrical conductor.

9. The device of claim 1 wherein the sensor circuitry comprises circuitry of a first sensor configured to monitor a first aspect of the characteristic of the electrical energy which is conducted using the electrical conductor, and further comprising a second sensor which is configured to monitor a second aspect of the characteristic of the electrical energy which is conducted using the electrical conductor, and wherein the first and second aspects are different.

10. The device of claim 1 wherein the sensor circuitry is electrically isolated from all ground references which are external of the sensor device.

11. The device of claim 1 wherein the sensor circuitry is electrically isolated from all electrical conductors which are external of the sensor device.

12. The device of claim 1 further comprising a housing which includes the attachment assembly.

13. The device of claim 12 wherein the housing and the attachment assembly are not supported by ground apart from support from the conductor.

14. The device of claim 1 wherein an entirety of the sensor device is supported solely by the conductor.

15. The device of claim 1 further comprising processing circuitry configured to process an output of the sensor circuitry to calculate phasors.

16. An electrical power system monitoring method comprising:
    using a plurality of sensor circuits, monitoring a characteristic of electrical energy which is conducted using an electrical conductor of an electrical power system;
    using the sensor circuits, generating a plurality of data signals which correspond to different aspects of the electrical characteristic of the electrical energy which is conducted using the electrical conductor; and
    processing the data signals to provide information regarding the electrical characteristic of the electrical energy being conducted within the electrical conductor; and
    wherein at least some of the sensor circuits are arranged with their respective sensitivity directions opposite to an electromagnetic field generated by the electrical energy which is conducted using the electrical conductor and the processing comprises processing to reduce noise detected by the sensor circuits.

17. The method of claim 16 wherein the monitoring comprises detecting electromagnetic fields about the electrical conductor using additional ones of the sensor circuits to monitor the characteristic comprising current of the electrical energy.

18. The method of claim 17 wherein the monitoring comprises monitoring the characteristic of the electrical energy using additional ones of the sensor circuits configured to monitor different ranges of intensities of the electromagnetic fields.

19. The method of claim 16 wherein the monitoring comprises monitoring the electrical characteristic at different axial locations of the electrical conductor using plural ones of the sensor circuits which are positioned adjacent to the different axial locations of the electrical conductor, and wherein the data signals comprise measurement data regarding the electrical characteristic of the electrical energy at the different axial locations of the electrical conductor.

20. The method of claim 19 wherein the measurement data comprises a plurality of samples, and further comprising generating the samples of the plural data signals at a plurality of common moments in time.

21. The method of claim 20 wherein the generating of the samples for one of the common moments in time comprises generating the samples for the one of the common moments in time at the same moment in time using the plural sensor circuits.

22. The method of claim 16 wherein the monitoring comprises monitoring the electrical characteristic at different distances from the electrical conductor using plural ones of the sensor circuits which are positioned at different distances from the electrical conductor, and wherein the data signals comprise measurement data regarding the electrical characteristic of the electrical energy at the different distances from the electrical conductor.

23. The method of claim 16 wherein the monitoring comprises monitoring the electrical characteristic using the plurality of the sensor circuits which are positioned adjacent to opposite sides of the electrical conductor.

24. The method of claim 23 wherein the processing comprises combining the data signals which are generated using the sensor circuits which are positioned adjacent to the opposite sides of the electrical conductor.

25. The method of claim 16 further comprising processing the data signals to detect presence of interference.

26. The method of claim 16 wherein the processing comprises processing the data signals to cancel noise in the data signals.

27. The method of claim 16 further comprising synchronizing the sensor circuits with respect to time, and further comprising generating a plurality of samples of the data signals using the plural sensor circuits which are synchronized with one another and a plurality of common moments in time.

28. The method of claim 16 wherein the monitoring comprises monitoring the electrical characteristic at different axial locations of the electrical conductor using the sensor circuits which are located adjacent to the different axial location of the electrical conductor, and wherein the processing comprises processing to provide information regarding a direction of flow of the electrical energy being conducted using the electrical conductor.

29. The method of claim 16 wherein the monitoring comprises monitoring using the sensor circuits which are electrically isolated from the electrical conductor.

30. The method of claim 16 wherein the sensor circuits are embodied within a single sensor device, and further comprising, before the processing, wirelessly communicating measurement data of the data signals to a receiver device using wireless communications circuitry of the single sensor device.

31. An electrical power system monitoring system comprising:
    a plurality of sensor devices which are individually configured to monitor an electrical characteristic of electrical energy which is conducted using an electrical conductor of an electrical power system, to generate a plurality of data signals which are indicative of the monitored electrical characteristic of the electrical energy, and to communicate the data signals externally of the individual sensor device; and
    a receiver device configured to receive the data signals which are communicated by the sensor devices and to coordinate at least one operation of the sensor devices with respect to the monitoring of the electrical characteristic of the electrical energy.

32. The system of claim 31 wherein the data signals individually include measurement data indicative of the electrical characteristic monitored by respective ones of the sensor devices, and wherein the receiver device is configured to combine the measurement data from the different sensor devices into a composite signal.

33. The system of claim 31 wherein the sensor devices comprise wireless communications circuits which are configured to wirelessly communicate measurement data of the data signals, which is indicative of the monitored electrical characteristic by the respective sensor devices, to the receiver device.

34. The system of claim 32 wherein the receiver device is configured to synchronize the communication of the measurement data from the plurality of sensor devices to the receiver device to coordinate the at least one operation of the sensor devices.

35. The system of claim 31 wherein the receiver device is configured to synchronize sampling of the electrical energy by the sensor devices at a plurality of common moments in time to coordinate the at least one operation of the sensor devices.

36. The system of claim 31 wherein the electrical energy is conducted as a time-varying signal using the conductor, and the sensor devices generate a plurality of samples of the electrical energy at a common moment in time to provide information regarding the time-varying at a plurality of different axial locations of the conductor at the common moment in time.

37. The system of claim 36 wherein the receiver device is configured to synchronize the timing of the samplings by the sensor devices to coordinate the at least one operation.

38. The system of claim 31 wherein the sensor devices are configured to generate a plurality of samples of the electrical characteristic at a plurality of common moments in time and the receiver device is configured to associate the samples from the different sensor devices together in a plurality of groups according to the plurality of common moments in time.

39. The system of claim 38 wherein the receiver device is configured to associate timing information which identifies the common moments in time with respective ones of the groups.

* * * * *